US009287468B2

(12) United States Patent
Herner et al.

(10) Patent No.: US 9,287,468 B2
(45) Date of Patent: Mar. 15, 2016

(54) LED SUBMOUNT WITH INTEGRATED INTERCONNECTS

(71) Applicant: GLO AB, Lund (SE)

(72) Inventors: Scott Brad Herner, San Jose, CA (US); Linda Romano, Sunnyvale, CA (US); Daniel Bryce Thompson, Walnut Creek, CA (US); Martin Schubert, Sunnyvale, CA (US)

(73) Assignee: GLO AB, Lund (SE)

(*) Notice: Subject to any disclaimer, the term of this patent is extended or adjusted under 35 U.S.C. 154(b) by 0 days.

(21) Appl. No.: 14/549,904

(22) Filed: Nov. 21, 2014

(65) Prior Publication Data

US 2015/0179895 A1 Jun. 25, 2015

Related U.S. Application Data

(60) Provisional application No. 61/907,518, filed on Nov. 22, 2013.

(51) Int. Cl.

| | |
|---|---|
| ***H01L 27/15*** | (2006.01) |
| ***H01L 33/48*** | (2010.01) |
| ***H01L 33/62*** | (2010.01) |

(52) U.S. Cl.

CPC ............ *H01L 33/486* (2013.01); *H01L 27/156* (2013.01); *H01L 33/62* (2013.01); *H01L 2224/48091* (2013.01); *H01L 2224/48464* (2013.01); *H01L 2224/73265* (2013.01); *H01L 2933/0033* (2013.01); *H01L 2933/0066* (2013.01)

(58) Field of Classification Search

CPC ................. H01L 2924/00; H01L 2224/48091; H01L 2224/73265; H01L 2924/00014; H01L 2224/48247; H01L 2224/32245; H01L 2224/48227; H01L 2924/0002; H01L 25/0753; H01L 2224/32225; H01L 33/62; H01L 2224/16

USPC .................. 257/79–80, 98, E33.06, E33.059, 257/E33.076; 438/33

See application file for complete search history.

(56) References Cited

U.S. PATENT DOCUMENTS

2012/0175643 A1 7/2012 West

FOREIGN PATENT DOCUMENTS

| | | | |
|---|---|---|---|
| JP | 2006-332234 | A | 12/2006 |
| JP | 2013-110210 | A | 6/2013 |
| KR | 10-1144351 | B1 | 5/2012 |
| KR | 10-2013-0083173 | A | 7/2013 |

OTHER PUBLICATIONS

International Search Report and Written Opinion received in connection with international application No. PCT/US2014/066919; mailed Mar. 5, 2015.

*Primary Examiner* — Mark A Laurenzi

(74) *Attorney, Agent, or Firm* — The Marbury Law Group PLLC

(57) ABSTRACT

A submount for light emitting diode (LED) die includes a substrate containing a plurality of tubs configured to receive an LED die, and a plurality of integrated interconnects integrated into the substrate. At least a portion of the interconnects for each tub have an exposed portion on a side of the submount and at least some of the plurality of the interconnects are not connected to other interconnects in the submount.

10 Claims, 20 Drawing Sheets

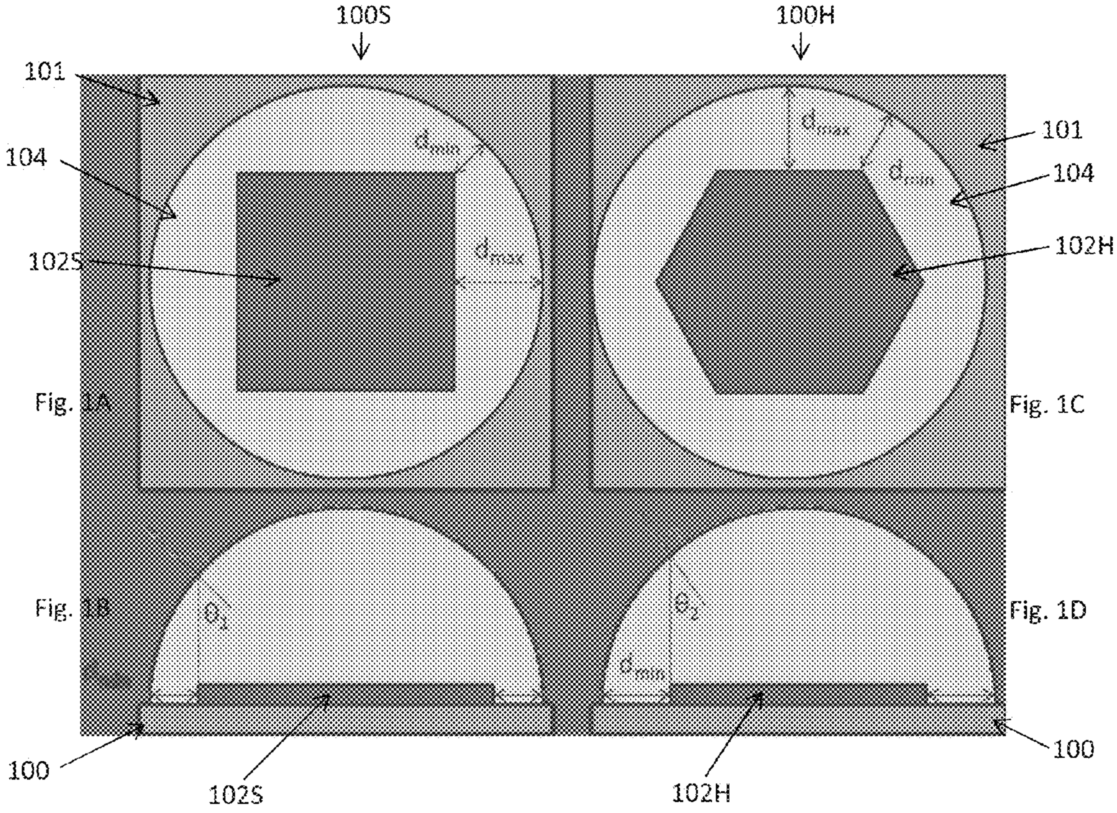
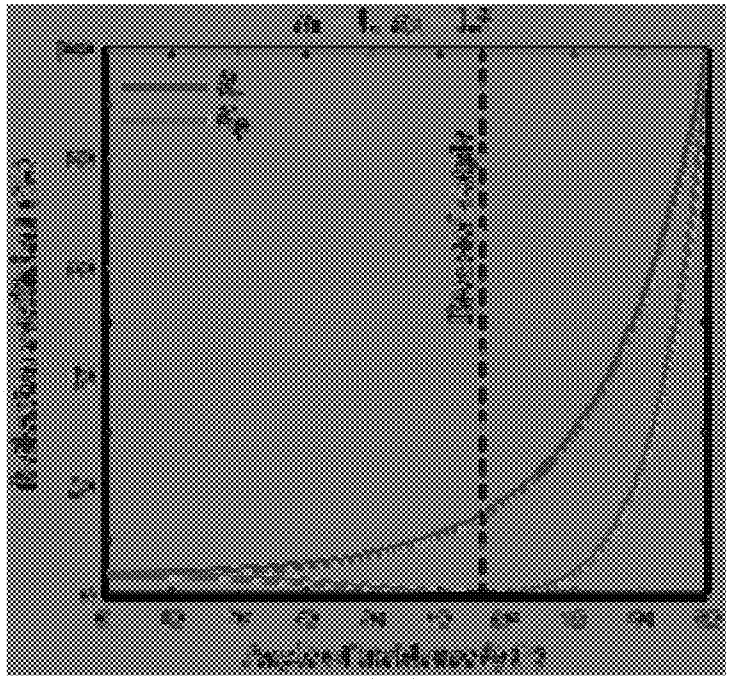
Fig. 2

102

140
n⁺⁺ Si
126
147

142

144

M5
Cu
145
146

148

150A
150B
150A

LED
102

152

LED SUBMOUNT WITH INTEGRATED INTERCONNECTS

FIELD

The embodiments of the invention are directed generally to packaging of semiconductor devices, such as light emitting diodes (LED), and specifically a LED submount with integrated interconnects.

BACKGROUND

LEDs are used in electronic displays, such as liquid crystal displays in laptops or LED televisions. Conventional LED units are fabricated by mounting LEDs to a substrate, encapsulating the mounted LEDs and then optically coupling the encapsulated LEDs to an optical waveguide.

Typically, numerous LEDs are fabricated simultaneously on a single wafer and then the wafer is diced to form individual LEDs. When dicing the individual LEDs from a sapphire substrate, the sapphire substrate is thinned to approximately 100 um and then etched or mechanically scratched to create scribe marks for a subsequent break step using an anvil. Alternatively, the scribe marks may be formed with a laser.

Fabricating individual LEDs using the conventional dicing methods may result in damage to the wafer and the LEDs. For example, a continuous GaN layer on a sapphire substrate imparts a compressive stress on the underlying sapphire substrate which can affect the curvature of the substrate and may lead to undesired breakage of the substrate and destruction of the LEDs on the substrate.

SUMMARY

One embodiment provides a submount for light emitting diode (LED) dies including a substrate comprising a plurality of tapered tubs and a plurality of integrated interconnects integrated into the substrate.

Another embodiment provides a method of mounting light emitting diode (LED) dies including forming a plurality of integrated interconnects which are integrated into the substrate using metal deposition and patterning, forming a plurality of tapered tubs in a substrate using photolithography and etching; and placing a plurality of LED dies into the plurality of tapered tubs after the step of forming a plurality of integrated interconnects.

Another embodiment provides a submount for light emitting diode (LED) die including a substrate containing a plurality of tubs configured to receive an LED die, and a plurality of integrated interconnects integrated into the substrate. At least a portion of the interconnects for each tub have an exposed portion on a side of the submount and at least some of the plurality of the interconnects are not connected to other interconnects in the submount.

Another embodiment provides a submount for light emitting diode (LED) die including a plurality of tubs located in a first side of a submount substrate, a plurality of interconnects located on a second side of the submount substrate, the plurality of interconnects extending through the submount substrate to a bottom surface of the plurality of tubs, the plurality of interconnects providing independent electrical contact to an LED die in a tub of the plurality of tubs and one or more electrical contacts located inside the plurality of tubs.

Another embodiment provides a method of making a light emitting diode (LED) array including forming a plurality of vias extending through a substrate, filling the plurality of vias with an electrically conductive material to form a plurality of conductive filled vias, and forming a plurality of integrated interconnects which are integrated into a substrate, and which electrically contact respective plurality of conductive filled vias. The method also includes forming a plurality of tubs in the substrate using photolithography and etching, placing a plurality of LED die into the plurality of tubs after the step of forming the plurality of integrated interconnects, and dicing the substrate through the conductive filled vias to form exposed strip portions of the conductive filled vias exposed on a side of the substrate.

Another embodiment provides a method of making a submount for light emitting diode (LED) die, including forming plurality of tubs in a first side of a submount substrate and forming a plurality of holes. Each of the plurality of holes extends from a bottom surface of the each respective tub of the plurality of tubs to a second side of the submount substrate. The method also includes forming a plurality of interconnects located on a second side of the submount substrate, wherein the second side is opposite to the first side of the submount substrate, and wherein the plurality of interconnects extend through the respective plurality of holes in the submount substrate to be exposed in the bottom surface of the plurality of tubs; and forming one or more electrical contacts located inside the plurality of tubs.

BRIEF DESCRIPTION OF THE DRAWINGS

FIGS. 1A and 1B are schematic illustrations of a plan view and a side cross-sectional view, respectively, of a LED device with a square planar cross section.

FIGS. 1C and 1D are schematic illustrations of a plan view and a side cross-sectional view, respectively, of a LED device with a hexagonal planar cross section.

FIG. 2 is a plot of the reflection coefficient as a function of the angle of incidence for the LEDs of FIGS. 1A-1D.

DETAILED DESCRIPTION

Figure 3A:
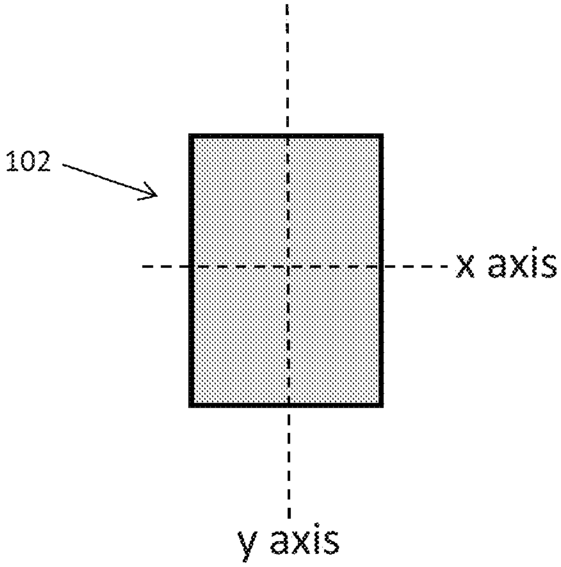
FIG. 3A is a schematic illustration of a top view of a rectangular shaped LED die with symmetry about the x and y axis.

The present inventors realized that prior art methods of singulating or dicing semiconductor devices, such as LED die from substrates, such as wafers, may result in damage to the wafer and the singulated LEDs. The present inventors have also realized that LED devices may be advantageously fabricated with the use of a semiconductor submount, such as a silicon submount with integrated interconnects in the submount. The present inventors have further realized that the fabrication of LED devices having large numbers of LEDs, such as thousands, such as tens of thousands, such as hundreds of thousands, such as millions, such as tens of millions, may be efficiently and inexpensively fabricated with the use of asymmetrically shaped LED die. In an embodiment, the first color (e.g., red) LED die have a first asymmetrical shape, the second color (e.g., green) LED die have a second asymmetrical shape and the third color (e.g., blue) LED die have a third asymmetrical shape, where the first, second and third shapes are different from each other. In an embodiment, the submount comprises asymmetrical tubs which correspond to the asymmetrical LED die. In another embodiment, the submount may be vibrated to aid in locating the asymmetrical LED die into the asymmetrical tubs in the submount.

Compressive stresses up to 1 GPa may develop in GaN films grown on sapphire substrates depending on the thickness of the GaN film, the growth temperature and the dislocation density in the GaN film. Due to the lattice mismatch between the sapphire substrate and the III-V and or II-VI compound semiconductor materials of the LED nanowire materials used in nanowire LED devices, the nanowire LEDs are typically not directly grown on the sapphire substrates. Rather the LED nanowires are grown on a continuous GaN film deposited on the sapphire substrate. Thus, both planar and nanowire LED devices can be fabricated on sapphire substrates.

However, as discussed above, the amount of stress in the underlying GaN film can affect the curvature of the wafer and in some cases lead to wafer breakage. Thus, in conventional scribe/break methods typically used to create GaN LED devices, wafer breakage should be carefully managed. Typically, the sapphire substrate is thinned to approximately 100 μm and mechanically scratched or etched to create scribe marks for the subsequent break step using an anvil.

In some cases, mechanical dicing methods have been replaced by lasers. Laser scribing reduces breakage and allows for narrower dicing streets. This ultimately increases the die yield and the number of die/wafer.

Another advantage of a laser is that the power and focus can be controlled to manage the depth of the scribe. The inventors have realized that is property of the laser can be combined with the compressive stress in the GaN films on the sapphire nanowires to create alternative device geometries that would be difficult to achieve by conventional laser scribe/break methods. In another embodiment, the anvil breakage step may be replaced with a roller breaker process.

In an embodiment, streets are patterned through the LED device layers on a completed wafer of die and etched from the top side of the wafer to the sapphire substrate. Device geometries can include conventional shapes, such as squares or low-aspect ratio rectangles, as well as high-aspect ratio geometries, non-rectangular shapes, or shapes for which the convex hull of perimeter points is larger than the total shape area. High-aspect-ratio geometries are suitable for extremely compact packages and are desirable, for example, for backlighting applications.

In an embodiment, non-rectangular shapes include shapes which may be more circular than rectangular in character, e.g. hexagons, which in a package (device) 100 having a dome lens 104 yields improved package-level extraction efficiency compared to a square die with the equivalent area as illustrated in FIGS. 1A-1D and 2. FIGS. 1A and 1B are schematic illustrations of a plan view and a side cross-sectional view, respectively, of a LED device 100S which includes a LED die 102S with a square planar cross section. FIGS. 1C and 1D are schematic illustrations of a plan view and a side cross-sectional view, respectively, of a LED device 100H which includes a LED die 102H with a hexagonal planar cross section. In both cases, the LED die 102S, 102H are located on a substrate 101 and covered with a transparent, dome shaped lens 104.

In the embodiments, illustrated in FIGS. 1A-1D, the surface areas of the top surfaces of the LED die 102S, 102H are the same. As illustrated in FIGS. 1A-1D, when the surface areas of the LED die 102S, 102H are the same, the minimum distance $d_{min}$ from the hexagonal LED die 102H to the edge of the lens 104 is less than the minimum distance $d_{min}$ from the square LED die 102S to the edge of the lens 104. As a consequence in the difference in the minimum distance $d_{min}$, the incident angles $\theta_2$ for light emitted from edges of the hexagonal LED die 102H tend to be smaller than the incident angles $\theta_1$ for light emitted from edges of the square LED die 102S. This results is a smaller reflection coefficient. Therefore, light extraction efficiency will be greater for a LED device 100H with a hexagonal LED versus a LED device 100S with a square LED die 102S with the same light emitting surface area.

FIG. 2 compares the reflection coefficient as a function of the angle of incidence for the LED devices 100S, 100H illustrated in FIGS. 1A-1D. As illustrated in FIG. 2, the reflection coefficient $R_p$ for the LED device 100H with the hexagonal LED die 102H is lower than the reflection coefficient $R_S$ for the LED device 100S with the square LED die 102S for all angles between 10° and 90°.

The improved package-level extraction efficiency is due to the reduction of emission into low-extraction modes approaching whispering gallery modes, e.g., light emitted from the corners of a square die. In addition, the projected beam from such a die has a more circular character, which is beneficial for lighting applications. Similarly, alternative geometries, e.g. triangles, improve die-level extraction efficiency due to the reduction of whispering gallery modes. Other sophisticated shapes may also be beneficial for forming tightly-packed LED arrays incorporating different die types.

In an embodiment, pulsed laser methods are used to form a defect pattern inside the wafer which mimics the top surface street pattern. In an embodiment, a roller breaker is then used to separate the dies in the wafers.

FIG. 3A illustrates a top view of a rectangular shaped die with symmetry about the x and y axis. Standard singulation techniques involving thinning and then mechanically sawing wafers results in die 102 that are symmetric about the x and y axes as shown in FIG. 3. Symmetry of an object is defined as the object having a mirror image across the line of the axis.

Figure 3B:
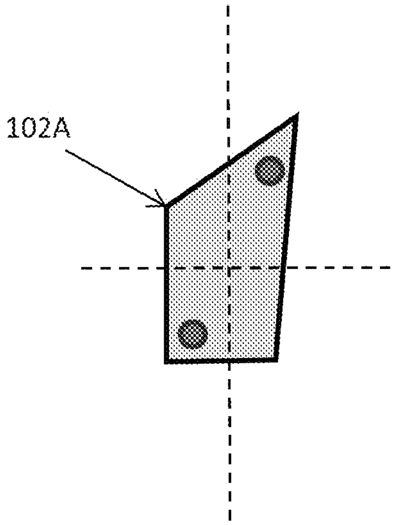
FIG. 3B is a schematic illustration of a top view of an asymmetrically shaped die according to an embodiment.

FIG. 3B illustrates an asymmetrically shaped die which may be fabricated according to the methods described below. As described in more detail below, asymmetrically shaped die may be located in corresponding asymmetrically shaped tubs on a submount. In this manner, LEDs that emit light at of preselected wavelength/color may be uniquely located or arranged in a preselected pattern in a submount.

Figure 4B:
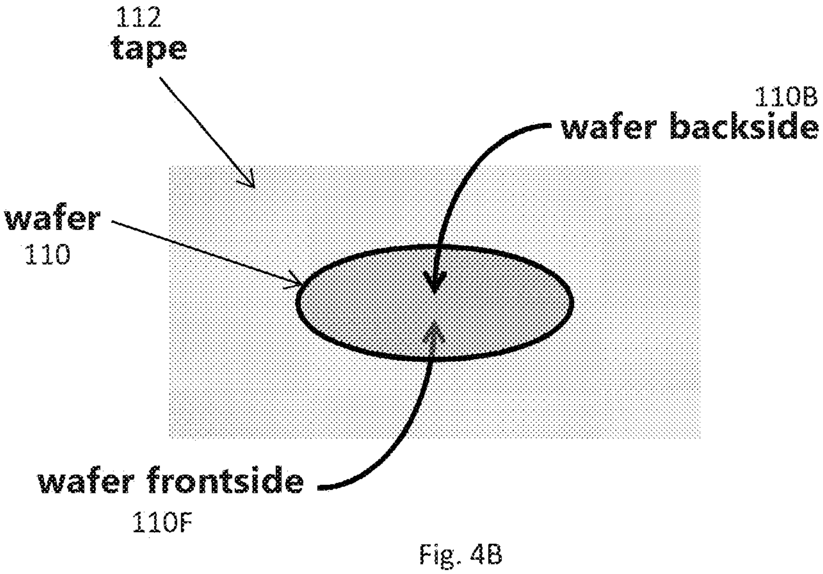
FIGS. 4A-4D are a schematic illustration of a plan view of steps in a method of singulating LED die.
Figure 4A:
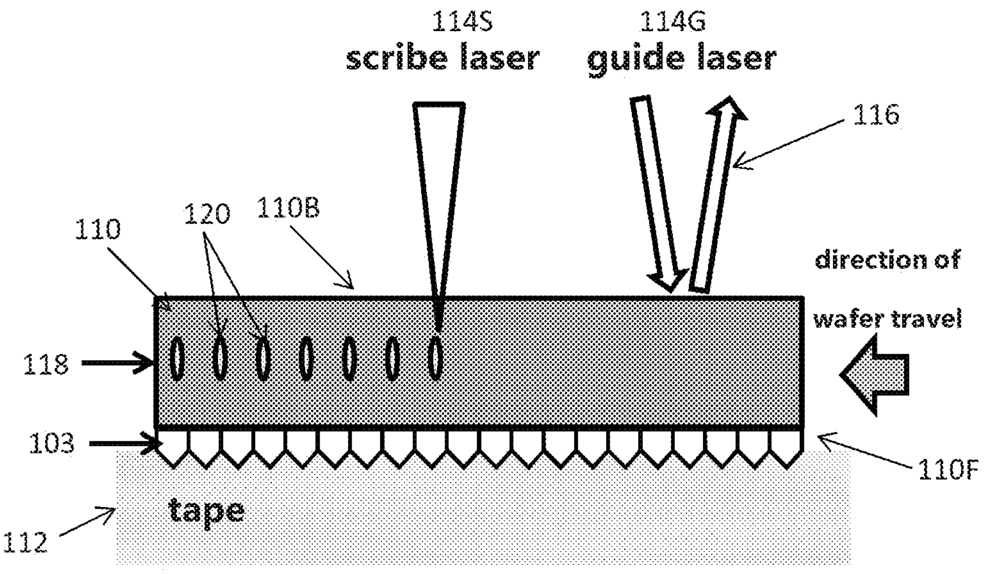

A laser defect generation and dicing technique known as stealth scribing, enables the singulation of die shapes without symmetry as illustrated in FIG. 3B. The stealth scribing processes is illustrated in FIGS. 4A-D. The semiconductor device layers 103, such as LED layers, are formed on the front side 110F of a wafer 110, as shown in FIG. 4A. As illustrated in FIGS. 4A and 4B, the wafer is thinned and then mounted on a tape 112, front side (device side) 110F down. The smooth back side 110B of the wafer 110 is exposed.

Stealth scribing involves a laser focused to an interior point in a wafer 110, resulting in a pattern defects 120 at the point of focus of the laser, as shown in FIG. 4A. As illustrated in FIG. 4A, two lasers, a guide laser 114G and a scribe laser 114S are typically used. The guide laser 114G measures the vertical height of the wafer 110 by reflecting light 116 off the smooth back surface 110B of the wafer 110. This measurement is fed back to the scribing laser 114S, which follows the guide laser 114G and focuses its energy at a consistent plane 118 inside the wafer 110. Preferably, the substrate is transparent to the scribing laser 114G. In an embodiment, the substrate is sapphire and the scribing laser 114S operates at a wavelength of approximately 532 nm.

Figure 4C:
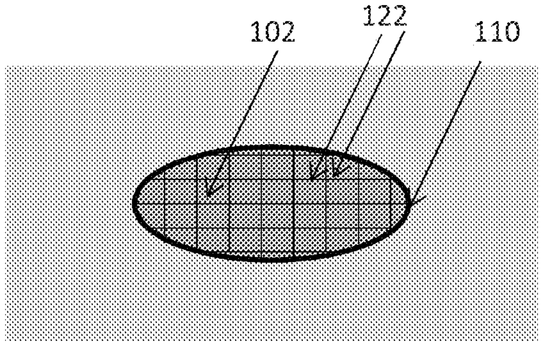

The scribe laser 114S is rastered around the wafer 110 in x-y locations, writing the shape of the LED die 102 shown in FIG. 4C by placing defects 120 along the lines where the die 102 will be broken. After laser "scribing" (i.e., writing) a pattern of defects 120 into the wafer 110, there is a pattern 122 of defects 120 within the wafer 110, but the wafer 110 is still whole. The defects 120 are typically not be visible to naked eye on the wafer 110.

Figure 4D:
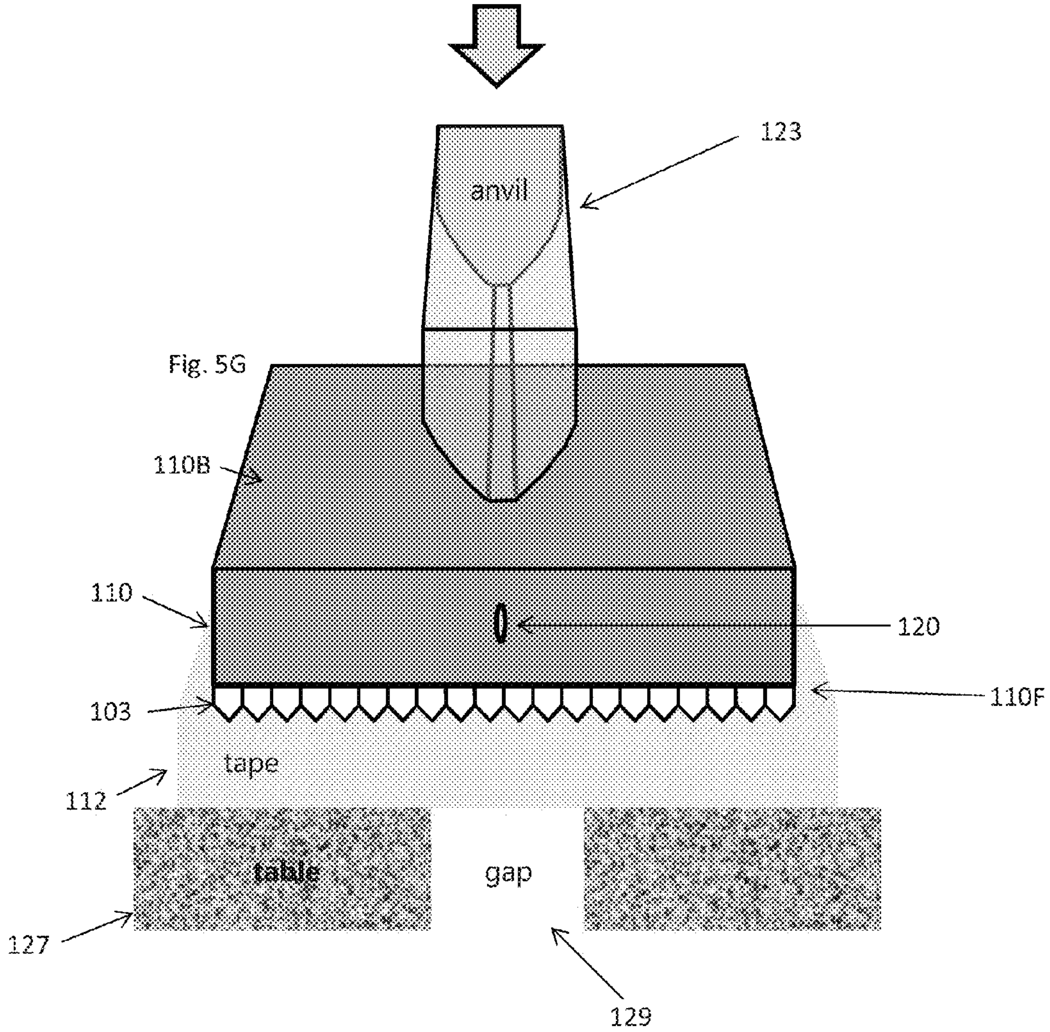

As illustrated in FIG. 4D, the LED die 102 are singulated from the wafer by pressing on the back of the wafer 110 with an anvil 123. Preferably, the wafer is located on a table 127 or other suitable surface having a gap 129 opposite the anvil 123.

Figure 6:
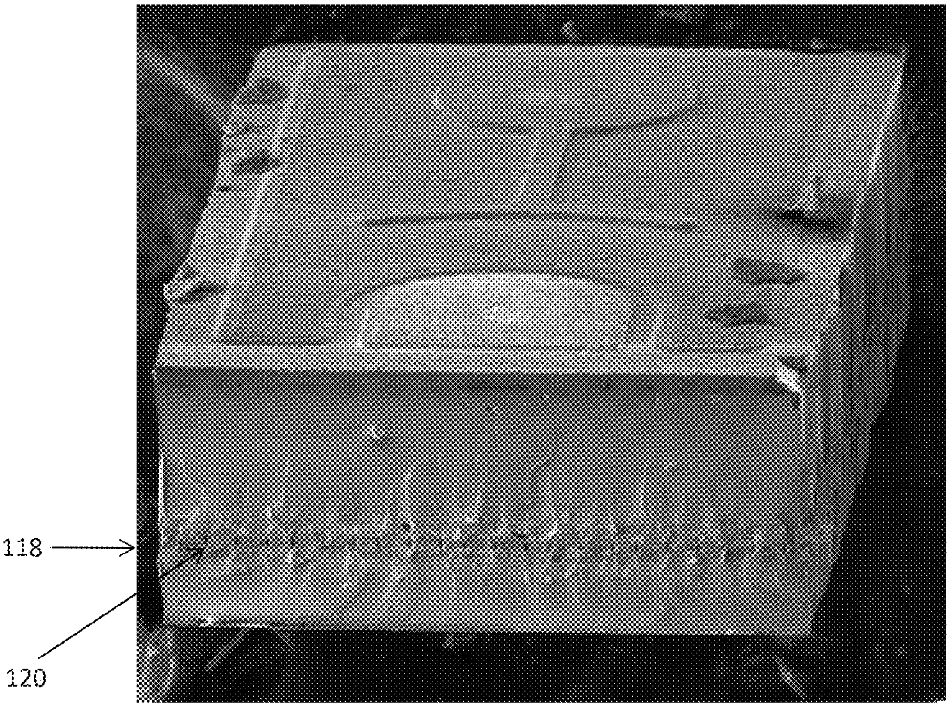
FIG. 6 is a photograph of a singulated LED die.

FIG. 6 is a photograph of a singulated die made according to the above method. The plane 118 of defects 120 is clearly visible in the photograph.

Thus, as described above, stealth scribing involves the application of internal defects to a wafer by laser focusing, and then anvil breaking the wafer along the lines of defects. Stealth scribing uses preferred crystalline orientations for cleaving as there is still a minimum force needed for anvil breaking to break the wafer. "Preferred crystalline orientations" means there are certain orientations that will cleave preferential to other non-preferred orientations.

In one embodiment method of the present invention, the present inventors realized that etching of the continuous compressive stress layer which is uniformly compressively stressing the substrate, raises the local stress at etched grooves, which aids the dicing process after generating a defect pattern in the substrate using a laser. For example, a III-nitride buffer layer, such as a GaN buffer layer, on a sapphire substrate may be selectively etched to form street grooves which expose the substrate, creating local areas of increasing stress. Increasing the local stress decreases the force needed to break the substrate. Internal defects are then applied using the laser, as described above. Because of the increased local stress, the substrate can be broken with less force (e.g. roll breaking instead of anvil breaking), and can theoretically break in patterns inconsistent with the sapphire crystal preferred cleaving orientation.

In one embodiment, the method of dicing the substrate shown in FIGS. 5A-5E includes depositing a continuous first layer 105, such as a GaN buffer layer, over the substrate 110, such as a sapphire wafer. The first layer 105 imparts a compressive stress to the substrate.

Figure 5A:
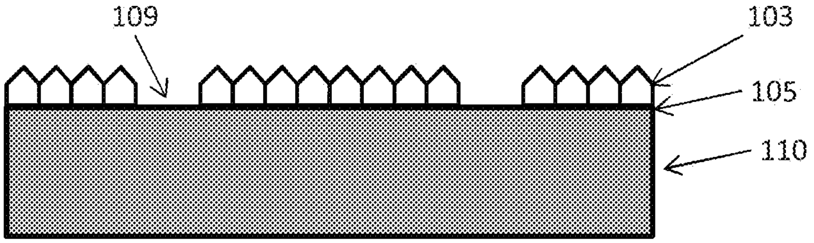
FIGS. 5A-5E are schematic illustrations showing the steps in methods of singulating LED die according to an embodiment of the invention.
Figure 5B:
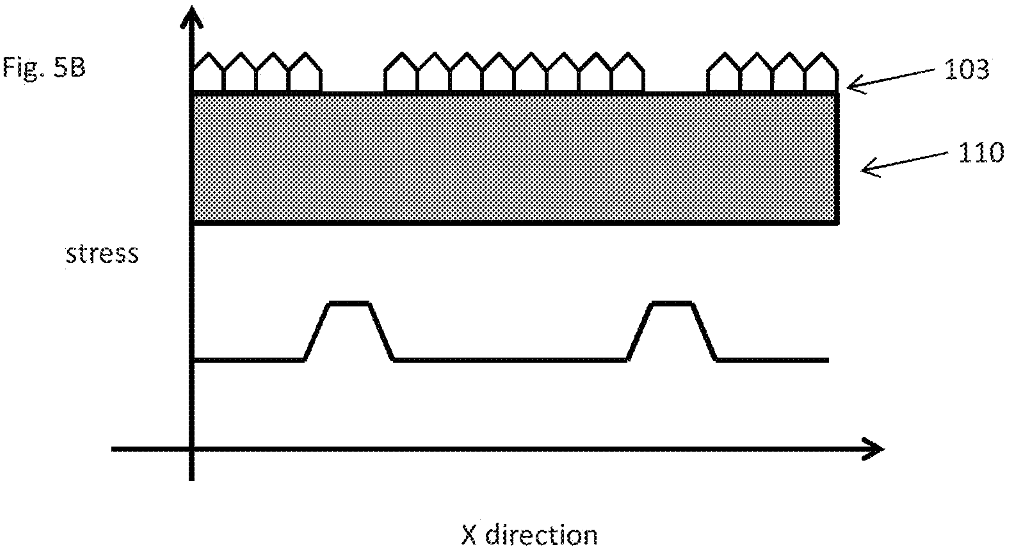

The method also includes etching grooves 109 in the first layer 105 to increase local stress at the grooves compared to stress at the remainder of the first layer located over the substrate, as shown in FIG. 5B. The step of etching grooves 109 comprises etching street grooves in inactive regions through the LEDs (i.e., LED layers) 103 and through the first layer 105 to expose the substrate and to define a pattern of individual LED die on a first side of the substrate.

Figure 5C:
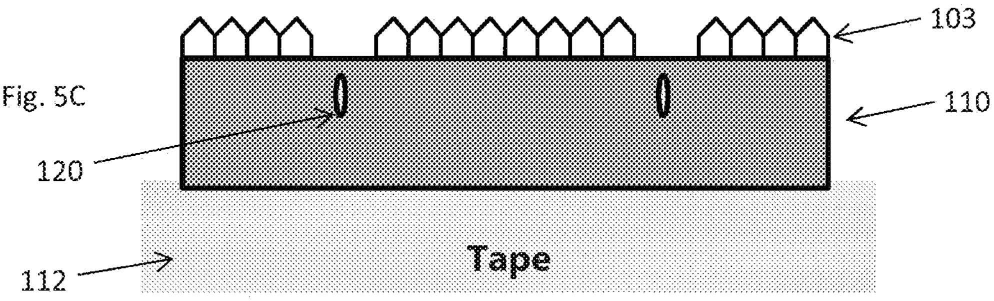
Figure 5D:
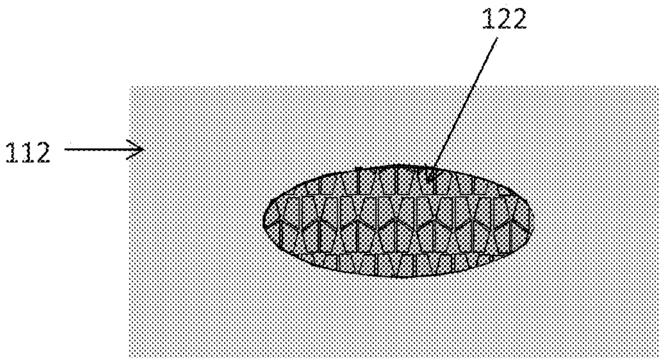

The method also includes generating a pattern 122 of defects 120 in the substrate with a laser beam, as shown in FIGS. 5C and 5D. The location of the defects 120 in the pattern 122 of defects substantially corresponds to a location of at least some of the grooves 109, and preferably all of the grooves, in the in the first layer 105. The street grooves 109 and the pattern 122 of defects 120 mimic a pattern of individual LED die 102.

Figure 5E:
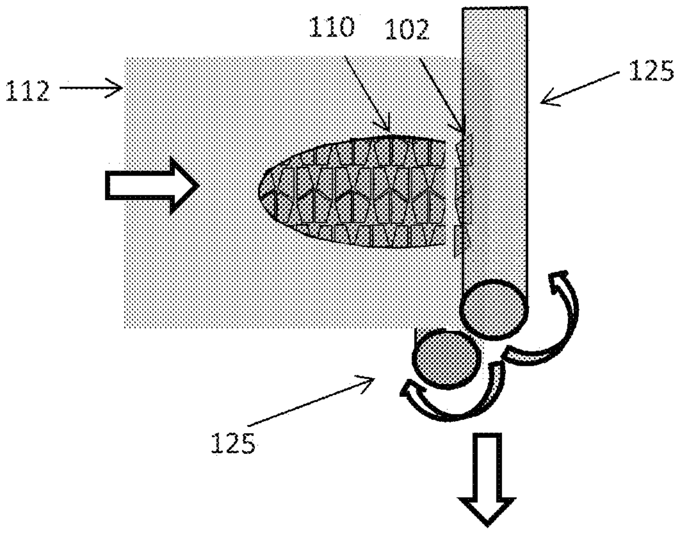

Finally, the method includes applying pressure to the substrate to dice the substrate along the grooves, as shown in FIG. 5E. The pressure may be applied by roll breaking using roller (s) 125 rolled on the substrate 110 to form LED die 102.

Specifically, as illustrated in FIG. 5A, after fabricating the GaN buffer layer 105 and LED layers 103, either planar or nanowire, on the front side 110F of the substrate (e.g., sapphire wafer) 110, street grooves 109 are etched through the LED layers 103 and the buffer layer 105 down the surface 109 of the wafer 110 (the front 110F or device side of the wafer 110).

As illustrated in FIG. 5B, the compressive stress due to the continuous layer on the substrate, e.g. GaN on sapphire, results in peak stress concentrated in the streets 109 in the GaN buffer layer 105. This concentrated stress in the streets 109 aids in singulating the LED die 102 in a controlled manner and reduces loss caused by cracks that might otherwise meander away from the streets 109 and damage adjacent die 102.

The wafer 110 is then thinned and mounted front side 110F onto a tape 112 or another support which keeps the singulated die 102 from scattering once they are singulated. Laser damaged regions (i.e., defects) 120 may be introduced into the wafer 110 with a laser as described above. Damaged regions 120 may be introduced with the laser either through the top (device) side 110F or the bottom (back) side 110B of the wafer 110. The pattern 122 of defects 120 preferably comprises a region of defects located less than 10 microns below a surface of the substrate 110.

The patterns 122 of defects shown in FIG. 5D are for illustration purposes only. Other patterns may be produced as desired. The pattern 122 illustrated in FIG. 5D results in asymmetrically shaped LED die 102 while the pattern 122 illustrated in FIG. 4C results in symmetrically shaped LED die 102. The wafer 110 is weakened in the locations that define the shape of the LED die 102.

The wafer 110 is then subjected to roll breaking with rollers 125, as shown in FIG. 5E. In an embodiment, two counter rotating rollers are used to singulate the LED die 102. The substrate 110 may cleaved along a non-preferred crystalline cleaving orientation during the step of applying pressure to the substrate to dice the substrate along the grooves 109. With this method, LED die 102 with symmetric and asymmetric die shapes can be made as shown in FIGS. 4D and 5E.

FIGS. 7-11 illustrate submounts 124 according to other embodiments. The submounts 124 may be non-semiconductor submount, such as sapphire, $SiO_2$ (e.g., quartz or glass) or semiconductor submounts, such as silicon or silicon carbide. The submounts 124 may used for example, in an integrated backlight unit for a LCD display. In an embodiment, the submount 124 is fabricated with standard metal interconnects, described in more detail below, prior to attaching the die 102. In an embodiment described in more detail below, the submount 124 includes symmetrical tubs 126 in which the LED die 102 are located. In the embodiment illustrated in FIG. 7, the submount 124, includes asymmetrical tubs 126A with the same asymmetric shape as the asymmetrical LED die 102A. Several different asymmetric tub 126A shapes can be etched into the submount 124 which allows for several different LED die 102A to be integrated into the submount 124, as illustrated in FIG. 8A. In an embodiment, the submount 124 is made of silicon.

Figure 7:
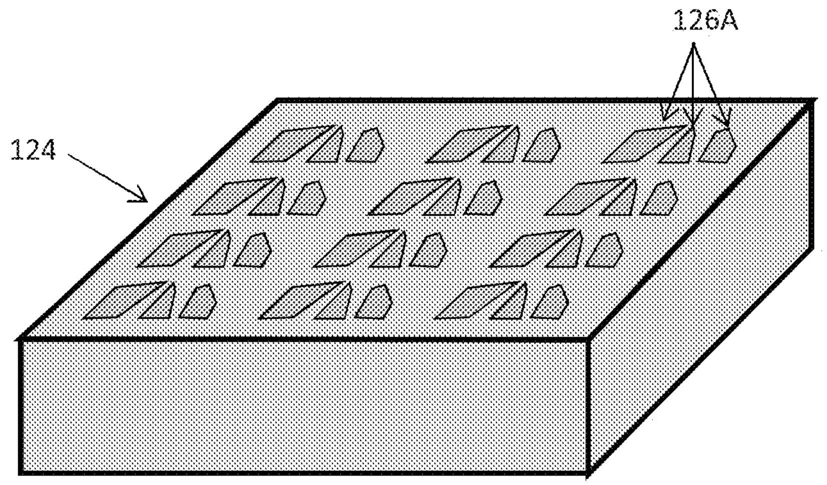
FIG. 7 is a perspective illustration of a submount according an embodiment.

Another embodiment is drawn to a method of integrating asymmetrical LED die 102A into a submount 124 having asymmetrical tubs 126A as illustrated in FIG. 7. In this embodiment, the individual asymmetrical LED die 102A are dispensed onto the submount 124 while the submount is vibrated. This agitation aids in the placement of the correct asymmetrical LED die 102A fitting into the corresponding asymmetrical tub 126A. Preferably, only one combination of die and tub is possible. Also, the x-y asymmetry assures the correct side of the asymmetrical LED die 126A is "face up" (else the asymmetrical LED die 126A does not fall into the asymmetrical tub 126A). In an embodiment, when all the asymmetrical LED die 126A are placed in the correct asymmetrical tub 126A, heat is applied to the submount 124 for eutectic bonding. Eutectic bonding is a metallurgical reaction between two different metals with heating in which the metal form an alloy at a temperature below the melting temperature of either of the metals. In an embodiment, a film of one metal is deposited on the bottoms of the asymmetrical LED die 126A and a film of the other metal is deposited in the asymmetrical tubs 126A. An example of a suitable eutectic reaction for die attachment is Au—Sn. Gold and tin form an alloy upon heating to approximately 280° C.

In an embodiment, the metal interconnects are fabricated in the submount 124 before integrating the asymmetrical LED die 102A. In this embodiment, the asymmetrical LED die 102A can be wire bonded to the pad on the metal interconnects, as described in more details below. Wire interconnects on the submount 124 may be fabricated by standard silicon processing techniques prior to assembly of the LED device 100. After the asymmetrical LED die 102A are affixed to the submount 124, the front side of the die 124 may be electrically connected to the metal interconnects in the submount 124 by a direct write process, such as ink jet deposition or microdispense of metal interconnects. After metal connection from the LED die 102A to the submount, an encapsulant may be deposited over the LED die 102A.

Alternatively, if there are no interconnects on the submount 124, the interconnects may be deposited from the asymmetrical LEDs 102A to the submount 124 by direct write via inkjet printing of metal and deposition and patterning of a photoactive polyimide material. That is, in this embodiment, all of the metal interconnects are fabricated after the LED die 102A are assembled into the submount 124. Multiple layers of metal interconnects may be made by a direct write process using ink jet deposition of metal connects and deposition and patterning of a photoactive polyimide that acts as an insulator between the layers of metal interconnects.

As in the previous embodiment, after the asymmetrical LED die 102A are connected to the submount 124, encapsulant can be deposited over the asymmetrical LED die 102A with standard encapsulant techniques. In an alternative embodiment, the interconnects may be formed by a lift off process after depositing metal onto a patterned resist by evaporation or sputtering. The dielectric layers D1, D2, D3, D4 surrounding the interconnects may be formed by deposition, such as by chemical vapor deposition and patterning or any other suitable method.

The above described fabrication processes are more cost effective to assemble devices with large numbers of LED die 102A than existing methods involving printed circuit boards which require individual placement and attachment of LED die 102, and individual wire bonding of the individual LED die 102 to metal interconnects on the printed circuit board.

Figure 8A:
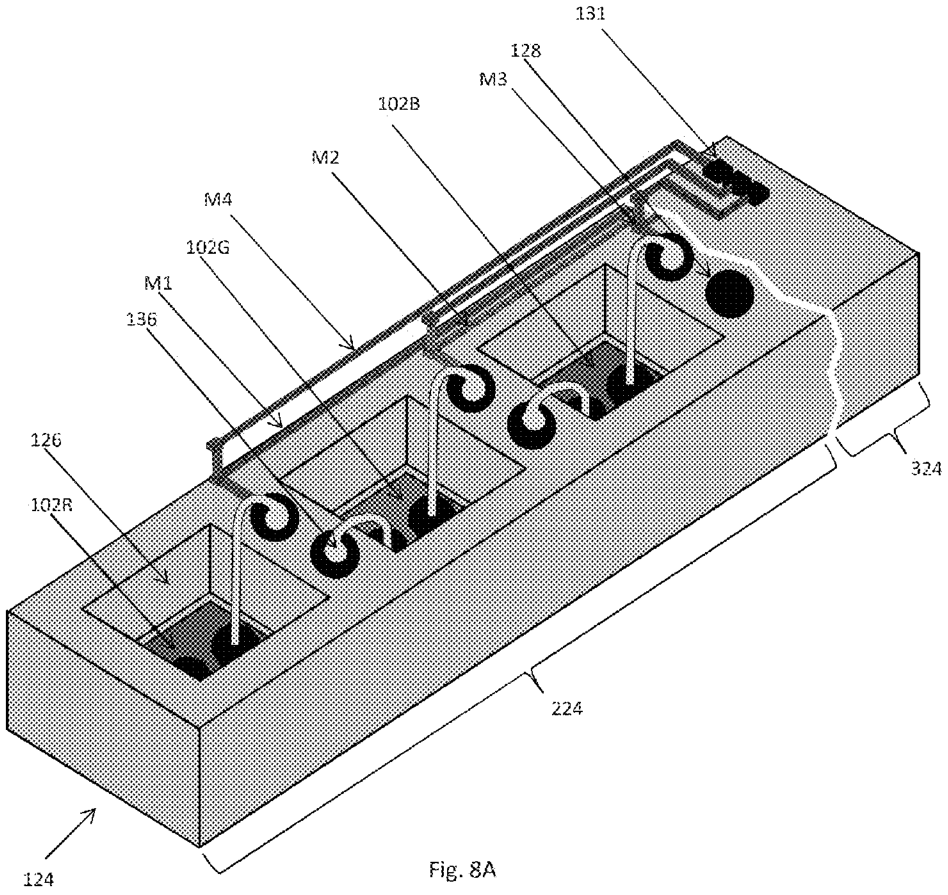
FIG. 8A is tilted perspective view of a submount according to another embodiment.
Figure 8B:
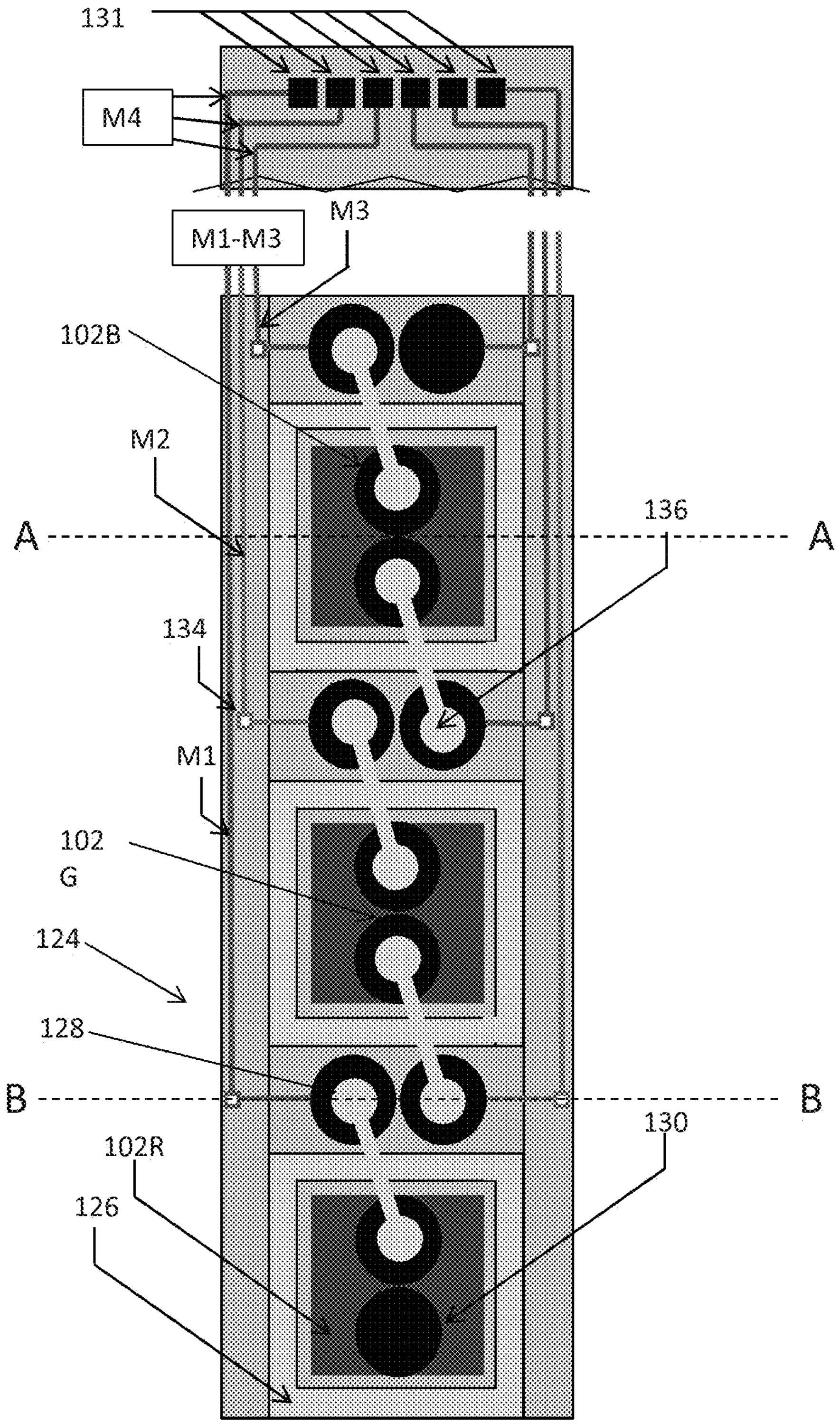
FIG. 8B is a plan view of the submount of FIG. 8A.
Figure 9:
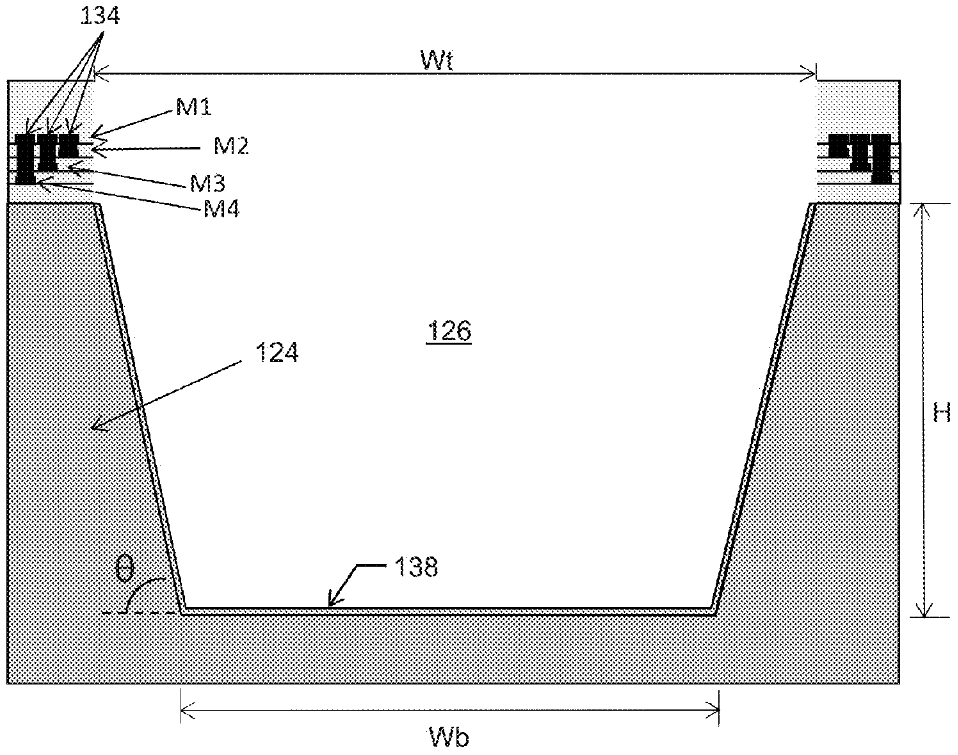
FIG. 9 is schematic illustration of a cross-sectional view of the submount of FIG. 8B through line AA.
Figure 10:
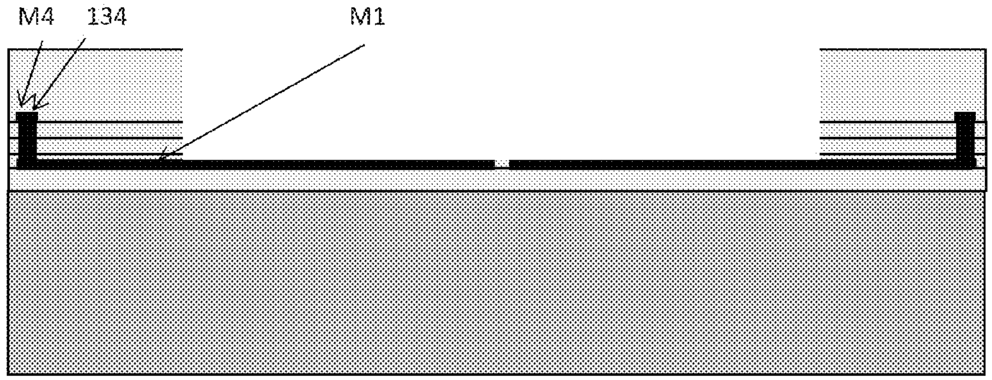
FIG. 10 is schematic illustration of a cross-sectional view of the submount of FIG. 9 through line BB.
Figure 11:
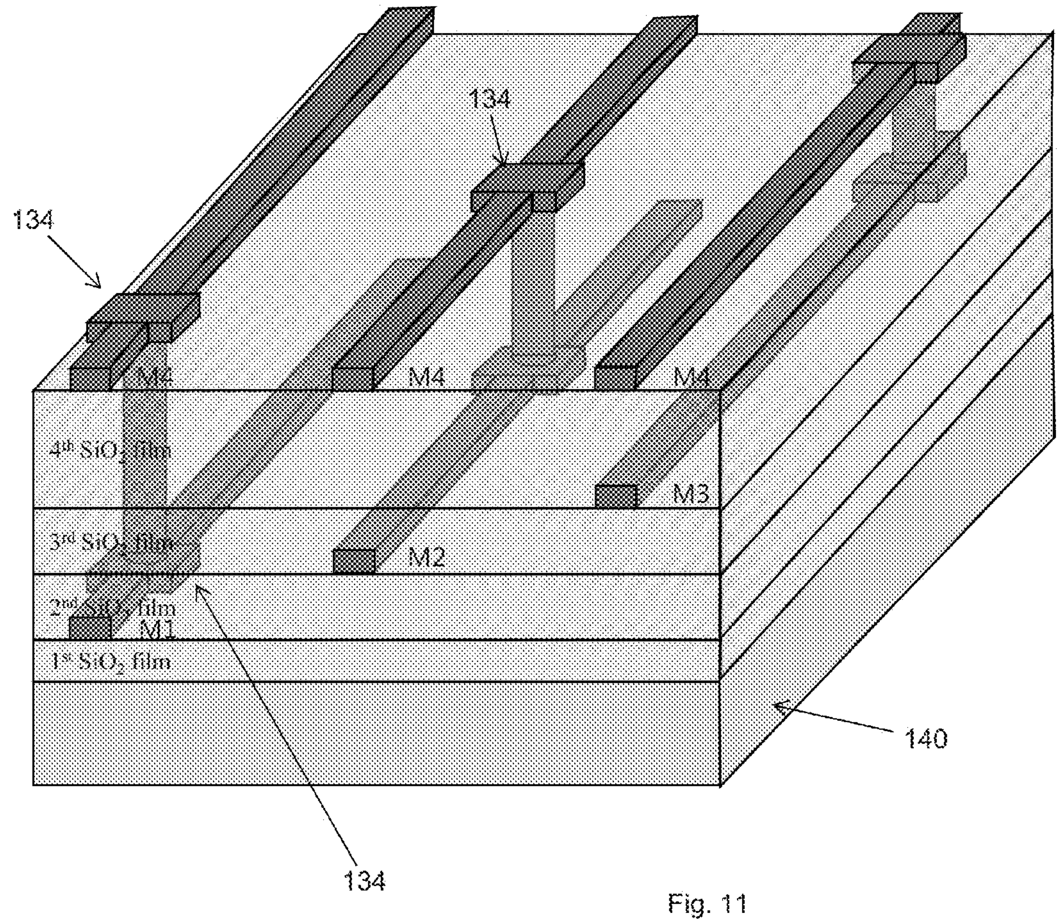
FIG. 11 is a three dimensional cut away view illustrating a portion of the submount of FIG. 8B.

FIGS. 8A-11 illustrate a silicon submount 124 suitable for use with an integrated back light unit according to another embodiment. The silicon submount 124 is less expensive to fabricate in mass production than some prior art packages. Features of the submount 124 include integrated multilevel interconnect fabrication with the submount, selective Ni/Ag plating of the tubs onto highly doped Si, and deep Si etch of tubs over existing multilevel interconnect stacks. FIG. 8A is tilt view of the submount 124. The submount 124 has a die portion 224 and a separate outside contact portion 324. For clarity, only half of the metal interconnects (metal lines M1, M2, M3, M4) are shown in FIG. 8A, the metal lines M1,M3, M3, M4 on the other side are not shown. FIG. 8B is a plan view of the submount 124 while FIGS. 9 and 10 are cross-sectional views of the submount 124 through lines AA and BB, respectively. The cross section illustrated in FIG. 9 is through one of the tubs 126 prior to attachment of an LED die 102. The cross section illustrated in FIG. 10 is through a pad area between tubs 102. FIG. 11 is a three dimensional cut away view illustrating a portion of the submount of FIG. 8B.

Each symmetric tub 126 is configured to hold an LED die 102. As illustrated in FIG. 9, the tubs 126 are preferably tapered. That is, the bottom of the tub 124 in which each LED die 102 is located has a width $w_b$ equal to or slightly larger than the width of the LED die 102 while the top of the tub 126 has a width $w_t$ larger than $w_b$. The top width $w_t$ is larger than $w_b$ to aid in locating the LED die 102 into the tubs 126 and to reflect light that is incident on the sidewalls in a direction normal (upward) to the plane of the LED die 102. The angle of the taper θ may be 75-85°, such as 80-85°.

In the embodiment illustrated in FIG. 8B, the submount 124 includes three symmetric tubs 126. In an embodiment, a first tub 126 includes a red LED die 102R, a second tub 126 includes a green LED die 102G and the third tub includes a blue LED die 102B. However, all of the tubs 126 may include LED die that emit the same color of light. Further, the submount 124 is not limited to three tubs 126. The submount 124 may have any number of tubs 126, such as 2-72, such as 3-60 tubs, such as 6-48 tubs. In an embodiment, a segment is defined as three tubs 126, typically including one red LED die 102R, one green LED die 102G and one blue LED die 102B. The submount may include 1-24 segments, such as 2-20 segments, such as 3-16 segments. The tubs 126 may be filled with either a transparent encapsulant, such as silicone, or a nontransparent encapsulant containing a phosphor that changes the wavelength (e.g., blue) of the light emitted from the LED die 102 to a different wavelength (e.g., red).

In the embodiment illustrated in FIGS. 8A, 8B and 9, the contacts to the electrodes of an outside power supply are shown in the outside contact portion 324. The die portion 224 may be repeated many times, such as 8 times, for a total of 24 LED die, but only one outside contact portion 324 with contacts 131 is needed for these 24 die. The individual outside contacts 131 connect each color LED(s) 102 to the power supply.

As illustrated in FIG. 8B, the submount 124 includes metal pads 128 between the tubs 126 for wire bonding. By placing the metal pads 128 between the tubs 126 rather than along the sides as in conventional submounts, the width of the submount can be reduced. Reduction of this width is valuable for maintaining a small form factor, as it is a part of the thickness of the display unit. Each LED die 102 includes corresponding bond pads 130. Wire bonds 136 connect the metal pads 128 on the submount 124 to the corresponding bond pads 130 on the LED die 102.

Also included in the submount 124 are metal lines M1-M4 which are used to supply current to the LED die 102. The "metal" lines M1-M4 may be made of any conductive material including metals and alloys, such as Al, Cu, W, Cr and TiW, as well as conductive compounds, such as TiN and indium tin oxide (ITO). While four lines are shown, other number of lines may be used. As illustrated in FIGS. 10 and 11, the metal lines M may be located in different levels within the submount 124 such that there are four levels M1, M2, M3, M4. The metal lines M1, M2, M3, M4 may be 1-10 μm in width, such as 2-5 μm. Further, the metal lines M1, M2, M3, M4 may be electrically isolated with dielectric layers D1, D2, D3, D4 as illustrated in FIG. 11, which also physically separates the layers. That is, dielectric layers D1, D2, D3, D4 may be deposited under and over the metal lines M1, M2, M3, M4 such that the metal lines M1, M2, M3, M4 are located in different levels above the submount substrate 140. As illustrated, metal lines M1, M2 and M3 are located within the submount 124. That is, metal lines M1, M2 and M3 are buried in the submount 124. In contrast, metal lines M4 are located on a top surface of the submount 124. The top metal layer, M4 in this case, connects the LEDs 102 to the outside power supply using the metal pad contacts 131. For example, lines M4 may be bus lines which provide current to electrode lines M1, M2, M3 which connect to the LED die 102. The top level metal, M4 in this case, is connected to the lower levels of metal lines M1-M3 with conductive material filled vias 135 (e.g. vias filled with an electrically conductive material, such as aluminum or copper). Each via 135 connects to the lower level at a feature in the lower level, such as metal landing pad 134. As illustrated, the metal landing pads 134 are square. However, the metal landing pads 134 may be circular, rectangular, hexagonal or any other suitable shape. Alternatively, the metal landing pads 134 do not have a shape. That is, the vias 135 may connect with the metal line M1-M4. In an embodiment, the landing pads 134 are square with sides 5-30 μm, such as 10-20 μm in length.

The present inventors also realized that single crystal silicon could be used to not only create submounts 124 with tubs 126 created in the silicon substrate, but could also be selectively electroplated with a highly reflective metal 138 in the tubs 126. The highly reflective metal minimizes light loss. The inventors also realized that multilayer interconnects could be fashioned on the Si submounts 124 which enable individual LED die 102 to be connected to one another on the submount 124. The use of multilayer interconnects, printed by standard photolithography techniques, enables the silicon submount 124 to have a small form factor, which is allows its use in space-sensitive devices such as mobile phones.

Thus, as also illustrated in FIG. 9, a metal film 138 lines the tub 126. The metal film 138 material (e.g., Au—Sn or Ni—Al) is selected to react with a second metal film (not shown) on the bottom of the LED die 102 to form a eutectic bond as discussed above. In an alternative embodiment, the metal film 138 may be a reflective material such as Ni—Ag. As discussed above, the metal film 138 may be selectively electroplated on the exposed heavily doped silicon.

Many copies of the silicon submount 124 may be reproduced on a silicon wafer simultaneously. The individual submounts 124 may be separated from each other physically by unpatterned silicon wafer sections called streets.

In an embodiment, the submount is made of silicon and includes integrated interconnects for an integrated back light unit. In an embodiment:

1. Red, green, and blue LED die 102R, 102G, 102B are 6-12, such as 8-10 mils square, e.g., a maximum of 210 μm. However, in alternative embodiments, other size LED die 102 may be used;
2. A 365 nm contact lithography stepper may be used to produce line/spaces of 5 μm/5 μm;
3. The tubs 126 may be 200-400 μm deep, such as 300 μm deep with 65-89 degree sloped sidewalls, such as 85 degree sidewalls;
4. The tubs 126 preferably have reflectors (i.e., film 138) on the bottom and sidewalls;
5. The street widths are less than 150 μm, such as 100 μm, if conventionally scribed and may be less if stealth scribed;
6. Al may be used as a hard mask when deep etching a Si submount. In alternative embodiments, a more refractory metal than Si, such as Cr, Ti, TiN, TiW, or W may be used on top of Al to resist the Si etch.

In an embodiment, the submount 124 may be 530 μm wide and 33,120 μm long, not including pads 131 to contact to the outside for power. Add 300 μm to the length for the 6 pads 131 that will attach to the outside world and the submount 124 length is 33,420 μm. On a 200 mm Si wafer with 3 mm edge exclusion, this enables 1355 submounts 124 per wafer.

An embodiment is drawn to a method of making the above submount 124. One aspect of the embodiment of the method includes the following process flow:

1. Starting material: mechanical grade highly doped 200 mm diameter Si wafers;
2. Deposit or grow 1000 Å $SiO_2$ film on the Si wafer; thickness can be anywhere from 200 Å to 10 μm. Alternately, photoactive polyimide can be used in place of the $SiO_2$, or other dielectrics, such as low-k SiCOH, SiN, $Al_2O_3$, etc dielectrics.
3. Pattern 300 Å Ti/1 μm Al (thin Ti for adhesion) lines on the $SiO_2$ by a lift off technique or mask and etch (metal 1, or M1); thicknesses can be anywhere from 50 Å to 1 μm of Ti and 2000 Å to 3 μm Al. Alternately there can be an antireflective coating on top of Al, typically Ti, TiN, WN, or Cr;
4. Deposit a second $SiO_2$ film 1 micron thick on top of M1; thickness can be anywhere from 200 Å to 10 μm, although in general, it should scale with the thickness of the metal;
5. Deposit a second Ti/Al line, or M2, on top of the second SiO2 film;
6. Deposit a third $SiO_2$ film on top of M2;
7. Deposit a third Ti/Al film M3 on top of the third $SiO_2$ film;
8. Deposit a fourth $SiO_2$ film on top of M3;
9. Pattern the fourth oxide film and dry etch $SiO_2$ to open the vias and pads to M1, M2, & M3;
10. Deposit, pattern, and etch Ti/Al film M4 on top of the fourth $SiO_2$ film; with the pads to M1, M2, and M3 open, M4 will now connect to the lower metal layers. M4 is called the bus line(s). In an embodiment, there are 6 discrete interconnects in M4, allowing n and p connections to the red, green, and blue LED. The LED can be connected in series or parallel at the designer's discretion. If a via connects each die to the bus line, then all LED are connected in parallel. If there are only vias at the first and last (e.g., $72^{nd}$) LED, then the LED are connected in series. Any other combination is also possible (e.g. connect every 3rd red LED, so that there are 3 in series, and that group of 3 is connected in parallel to 8 other groups of 3);

11. Deposit a fifth $SiO_2$ film on top of M4 (this final $SiO_2$ film forms the passivation);
12. Pattern the tubs, and proceed to dry etch the $SiO_2$;
13. Dry etch 300 μm deep tubs into the Si wafer. The tubs can be skipped (0 μm deep, or can be anywhere from 100 to 500 μm deep);
14. After Si etch, electroplate Ni/Ag into the exposed conductive Si. Typical reflective Ni/Ag thicknesses are 300 Å Ni/2000 Å Ag. Nickel thickness can range from 50 Å to 5000 Å, and silver thickness can range from 500 Å to 5 μm; Alternatively, a Au—Sn alloy or bilayer is deposited for eutectic bonding;
15. Singulate LED die using sawing or any of the other singulation methods;
16. Die attach by eutectic bonding or by epoxy or silicone adhesive, followed by curing of same;
17. Wire bond, e.g. with Au wire bonds;
18. Encapsulate, e.g. using silicone, which can alternately have a phosphor powder embedded in it, converting the LED's light from one wavelength to another.

Both Al and $SiO_2$ have excellent resistance erosion during silicon etch. When these materials are combined with a thick photoresist and time multiplexed deep silicon etch techniques, there is sufficient margin to etch 300 μm of silicon without significant erosion of features that are masked from the etch. Electroless nickel plating of silicon is an established technique to metallize silicon. Subsequent silver plating the nickel is also an established technique, and allows for the selective plating of the tubs while not plating the $SiO_2$-covered areas. Silicon submounts have advantages in wafer level packaging (high productivity fabrication), superior heat sink capability of silicon compared to more standard composite packages, and better thermal expansion match between silicon and sapphire compared to sapphire and composite packages. In an embodiment, all fabrication steps are performed at temperatures below 550° C., such as below 525° C., such as below 510° C. The submounts 124 described above incorporate multilayer interconnects that allow electrical connection of individual die contained within the submount 124, while maintaining a small form factor.

Figure 12A:
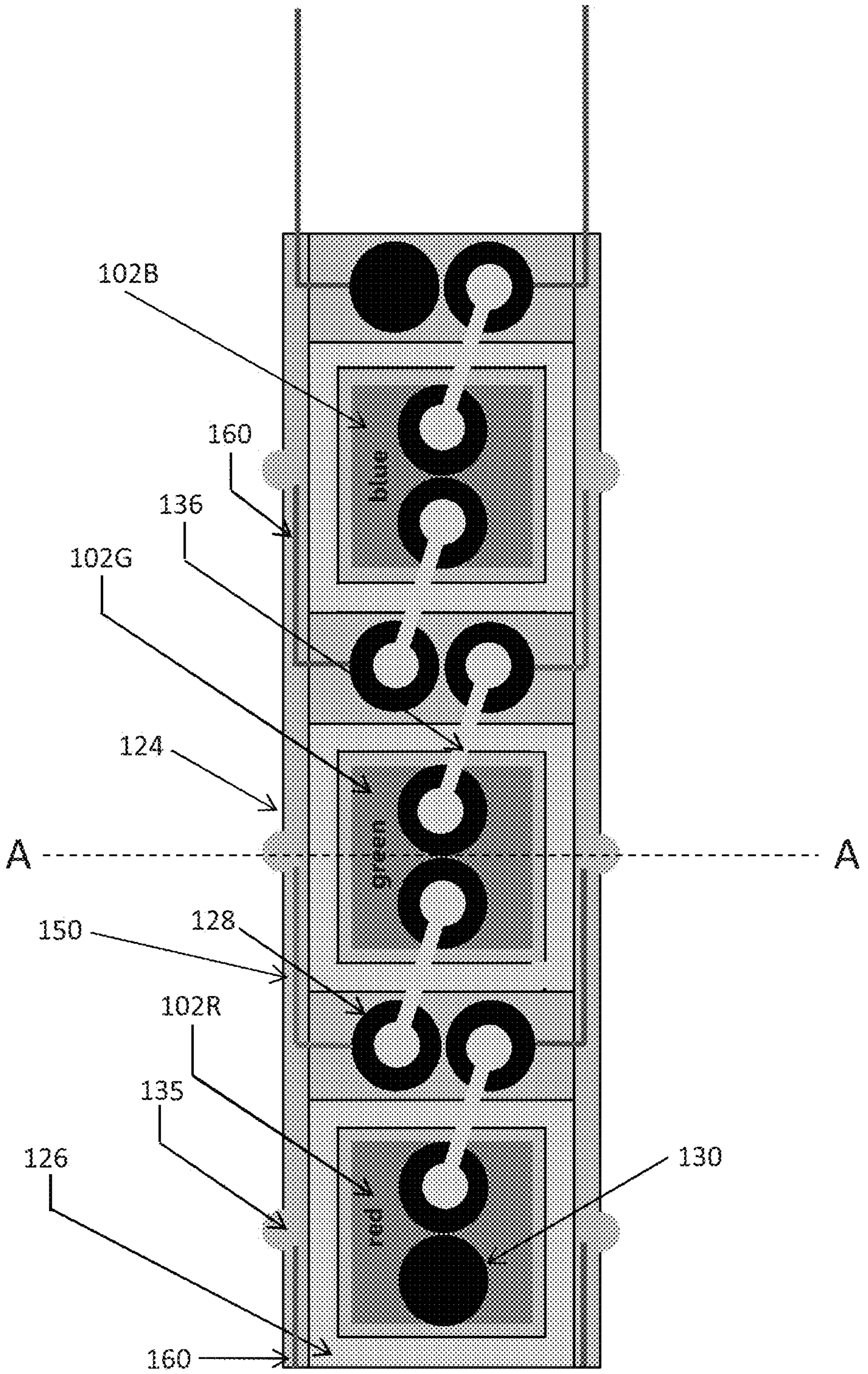
FIGS. 12A, 12B and 12C are plan views of a submount according to another embodiment.
Figure 12B:
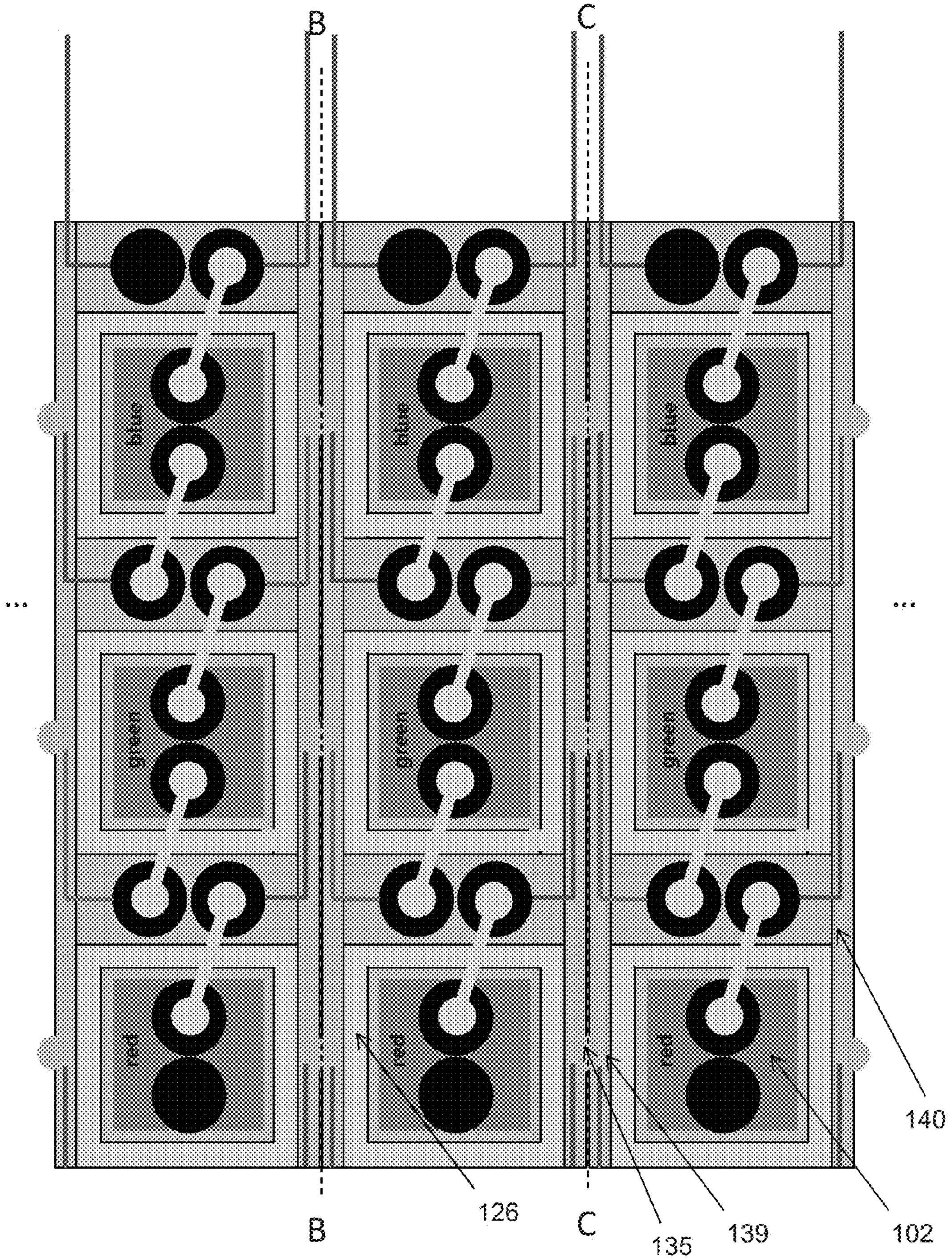
Figure 12C:
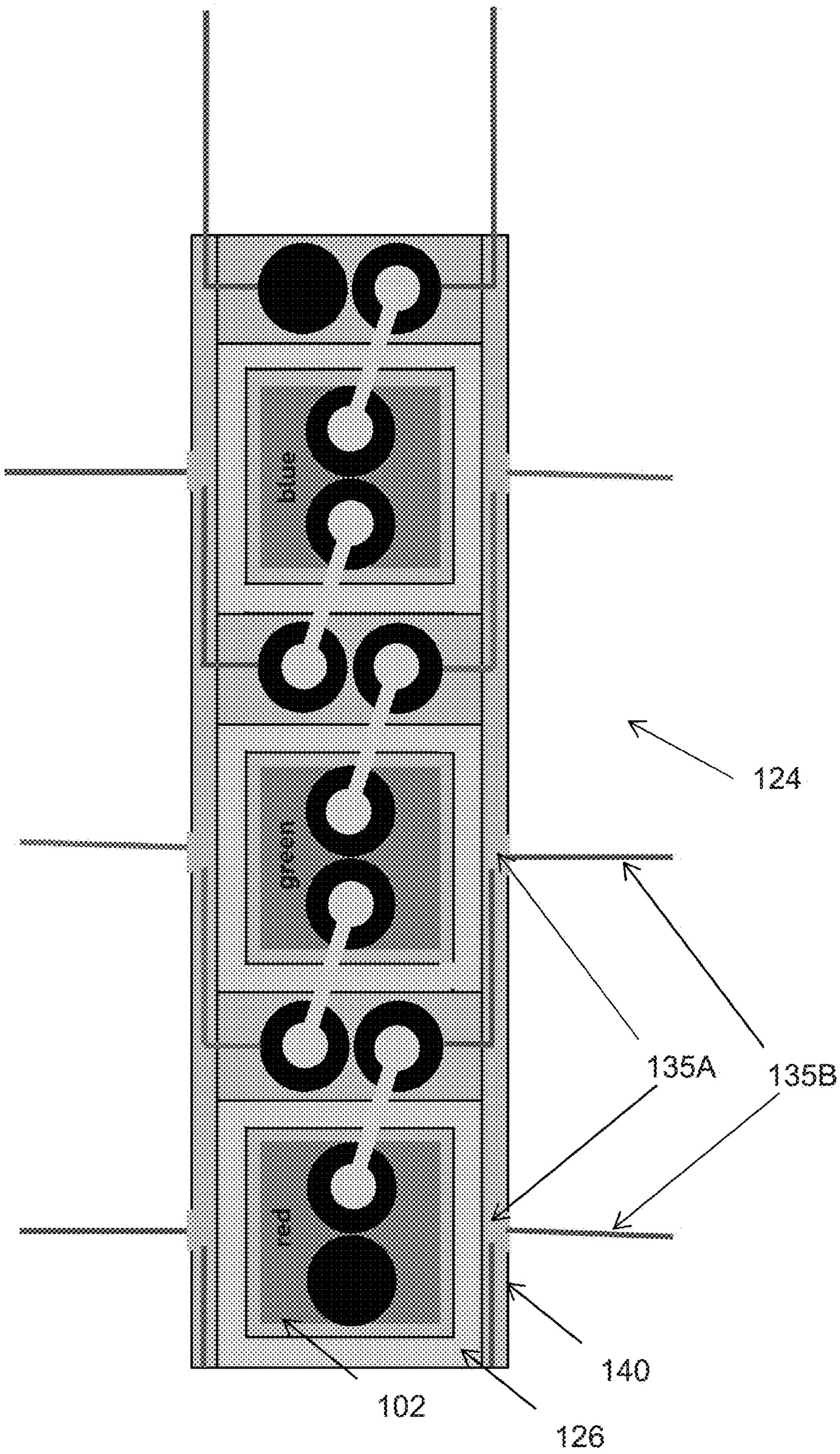
Figure 12D:
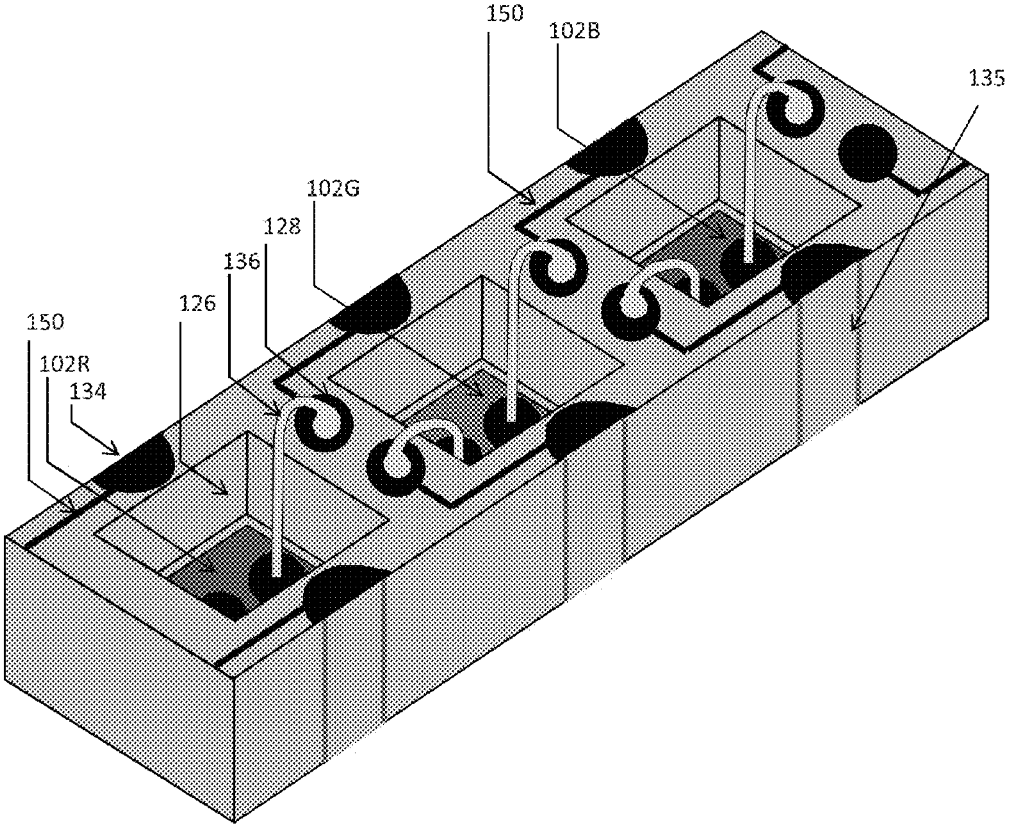
FIG. 12D is a tilted perspective view of the submount of FIG. 12A.
Figure 13A:
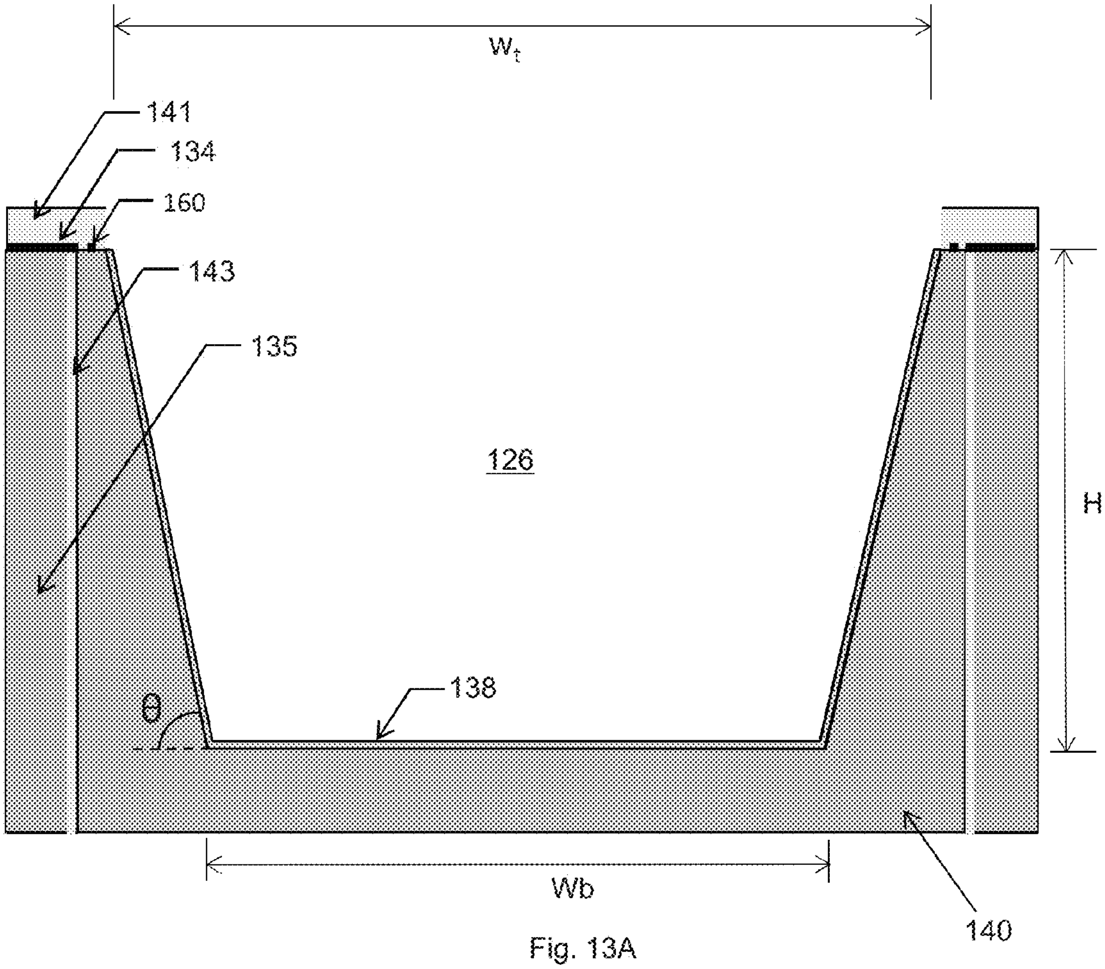
FIG. 13A is schematic illustration of a side cross-sectional view of the submount of FIG. 12A through line A-A.
Figure 13B:
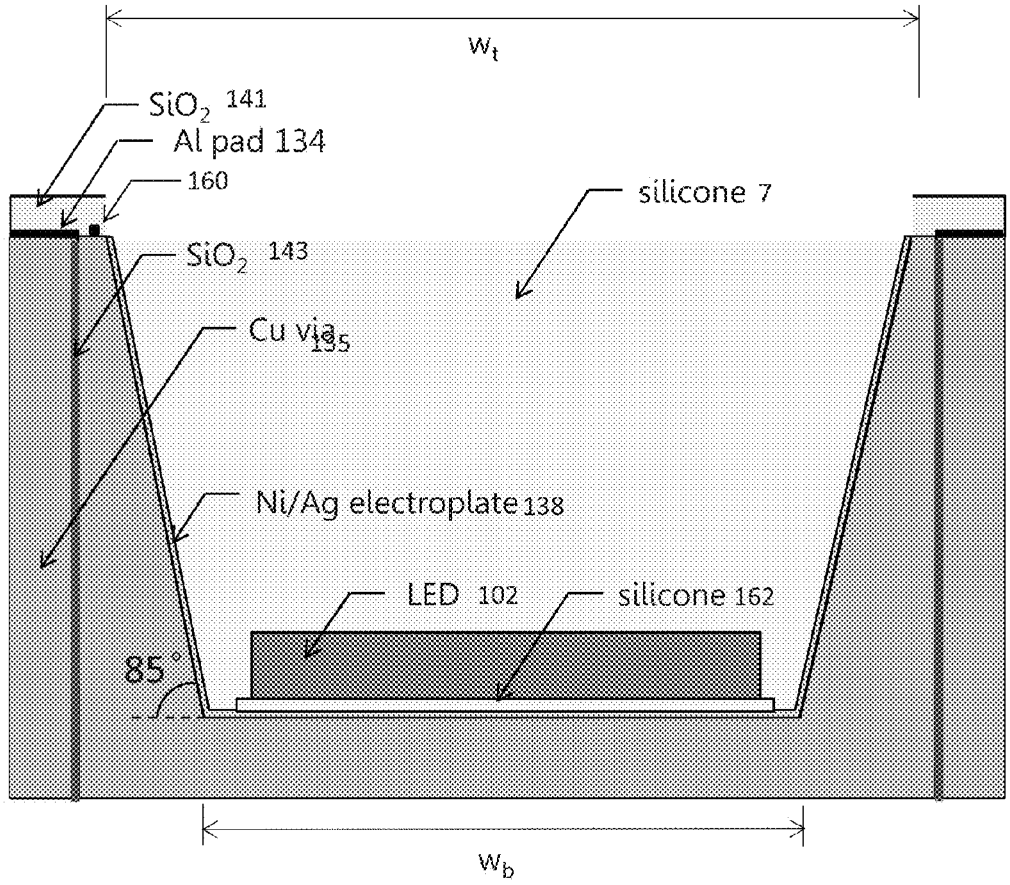
FIG. 13B is a schematic of the side cross-sectional view of FIG. 12A with an LED attached.

FIGS. 12A-D, 13A and 13B illustrate a submount 124 according to another embodiment. FIGS. 12A-C are plan views which include the LEDs 102 and wire bonds 136, while FIG. 12D is a tilt view. FIGS. 13A and 13B illustrate a side cross-section of the submount of FIG. 12A through line A-A, with (FIG. 13B) and without (FIG. 13A) the LED 102 and wire bonds to them. This embodiment does not include metal lines M1, M2, M3, M4 that extend through the length of the submount 124. That is, in contrast to the embodiment illustrated in FIGS. 8A-10, LED die 102 of the same color (e.g. LED red die 102R, green LED die 102G and blue LED die 102B) are not connected in series by the metal lines M1, M2, M3, M4. In contrast, this embodiment includes metal lines 160 on the surface of the submount 124 that are connected to conductive filled vias 135 on both sides of tubs 126. In this manner, each of the individual LED die 102 on the submount 124 is separately addressable. Thus, the individual LED die 102 can be connected in series or parallel or any combination of series and parallel. In an embodiment, the upper surface of the conductive filled vias 135 are covered with a metal pad 134. In an embodiment, the conductive filled via is filled with copper and the metal pad 134 is made of aluminum.

As illustrated in FIG. 13A, the tubs 126 are lined with a metal film 138 as in the previous embodiment. Preferably, the submount substrate 140 is made of silicon. To prevent current from shorting from the conductive filled via 135 to the submount substrate 140, a dielectric layer 143, such as $SiO_2$ may be formed on the surface of the submount substrate 140 to separate the conductive filled via 135 from the submount substrate 140. The dielectric layer 143 forms a shell which surrounds the conductive filled vias 135.

An embodiment of making the submount 124 of FIG. 12A is illustrated in FIGS. 12B, 12C, 13A and 13B. A cut out portion of the submount substrate 140 is shown in FIG. 12B. First, a pattern of through holes 139 may first be etched in the submount substrate 140, as shown in FIG. 12B. The through holes 139 may be 300-500 μm (e.g. 400 μm) deep and 50-100 μm (e.g. 80 μm) wide. The dielectric layer 143 shown in FIG. 13A may then be formed on the surface of the through holes prior 139 to filling the through holes with conductive material to form the conductive filled via 135. If the submount substrate 140 is made of silicon, the dielectric layer 143 may be made of silicon dioxide formed, for example, by oxidizing the surface of the through holes. Alternatively, the dielectric layer 143 may be made of silicon nitride made by CVD deposition of SiN.

The conductive filled via 135 may be made by depositing a seed layer of metal, such as copper or aluminum via electroless plating or any other suitable process followed by electroplating a conductor, such as Cu, to fill the through hole. Optionally, one or more barrier layers may be formed on the surface of the dielectric layer 143 in the through holes prior to forming the conductive filled via. Following formation of the conductive filled via 135, excess conductive material may be removed from one or both surfaces (e.g. the top and bottom) of the submount substrate 140 via chemical mechanical polishing (CMP) or any other suitable process.

In an alternative method of making the conductive filled via 135, a dual damascene process may be used. In this method, an oxide layer is formed over the surface of the submount substrate 140. Trenches are then patterned in the oxide layer and through holes patterned in the bottom of the trenches. The conductive filled vias 135 are made by filling the though holes and the trenches with conductive material, such as copper. As discussed above, excess conductive material can be may be removed from one or both surfaces (e.g. the top and bottom) of the submount substrate 140 via chemical mechanical polishing (CMP) or any other suitable process, such as etch back.

Next, as illustrated in FIG. 13A, after forming the conductive filled vias 135, a dielectric layer 141, such as $SiO_2$ may be deposited over conductive filled vias 135 and the metal lines 160. The dielectric layer 141 may be 0.150-200 μm, e.g. 1 μm thick. The dielectric layer 141 may then be patterned and dry etched to make openings above the conductive filled vias 135. Bond pads 134 may then be formed in openings in the dielectric layer 141. In an embodiment, the bond pads are made of aluminum.

Next, the tubs 126 are formed in the submount substrate 140, as shown in FIGS. 12B and 13A. The tubs 126 may be formed by patterning and etching, such as by dry or wet etching. Similarly to the embodiment illustrated in FIGS. 8A-10 above, a metal film 138 may be deposited on the sidewalls of the tubs 126. LEDs 102 may be attached to the submount 124 as discussed above.

Then, the substrate 140 may then be diced along lines B-B and C-C in FIG. 12B to form a plurality of elongated submounts 124, one of which is shown in FIGS. 12A and 12C. The submount 124 may have one row of tubs 126 each containing an LED die 102. Since the dicing lines B-B and C-C extend through the conductive filled vias 135, a portion 135A of each via is exposed in the side of each submount 124. In this manner, conductive strips 135A having a width of 10-100 μm (such as 40 μm) are formed on the sides of the submount 124. Thus, electrical contact can be made to LED die 102 in the submount 124 through the exposed strips 135A on the sides and/or bottom of the submount 124 for independent LED die control. For example, independent or common outside leads 135B are electrically connected to the exposed strip portions 135A of the conductive filled vias 135 exposed on the side(s) of the submount 124 substrate 140, as shown in FIG. 12C. The plurality of LED die may be electrically connected in series or in parallel or a combination of series and parallel using the outside leads 135B.

Thus, the method illustrated in FIGS. 12B, 12C and 13 includes forming vias extending through the substrate, filling the vias with an electrically conductive material to form conductive filled vias 135 which electrically contact respective ones of the plurality of integrated interconnects and forming a plurality of tubs 126 in the substrate 140 using photolithography and etching. The plurality of LED die 102B, 102G, 102R and then placed into the plurality of tubs (preferably one LED die to a tub 126), and the substrate 140 is diced through the conductive filled vias 135 to form exposed strip portions 135A of the conductive filled vias exposed on a side of the substrate 140. Then, outside leads 135B are electrically connected to the exposed strip portions 135A of the conductive filled vias 135 exposed on the side(s) of the substrate 140.

FIGS. 14A-14H are schematic side cross-sectional views illustrating a method of making a submount according to another embodiment. This embodiment also allows independent control similar to the embodiment illustrated in FIGS. 12A-C and 13A-B but by using bottom contacts 145 to the LED die 102 and metal M5 (described in more detail below) in a through hole 140 to the bottom of the tubs 126. In a first step illustrated in FIG. 14A, a submount substrate 140 is patterned such that tubs 126 etched in the submount substrate 140. Preferably, the tubs 126 are slightly larger than the LED die 102 which will be located in the tubs 126. In an embodiment, the tubs 126 are wider than the LED die 102 which will be located in the tubs 126 and are deeper than the thickness of the LED die 102. In an embodiment, the submount substrate 140 is approximately 100-400 μm, such as 200 μm-thick and the tub 126 is approximately 50-200 μm, such as 100 μm deep, leaving approximately 50-200 μm, such as 100 μm thick floor 147 in the tub 126.

Figures 14A, 14B, 14C, 14D, 14E, 14F, 14G, 14H:
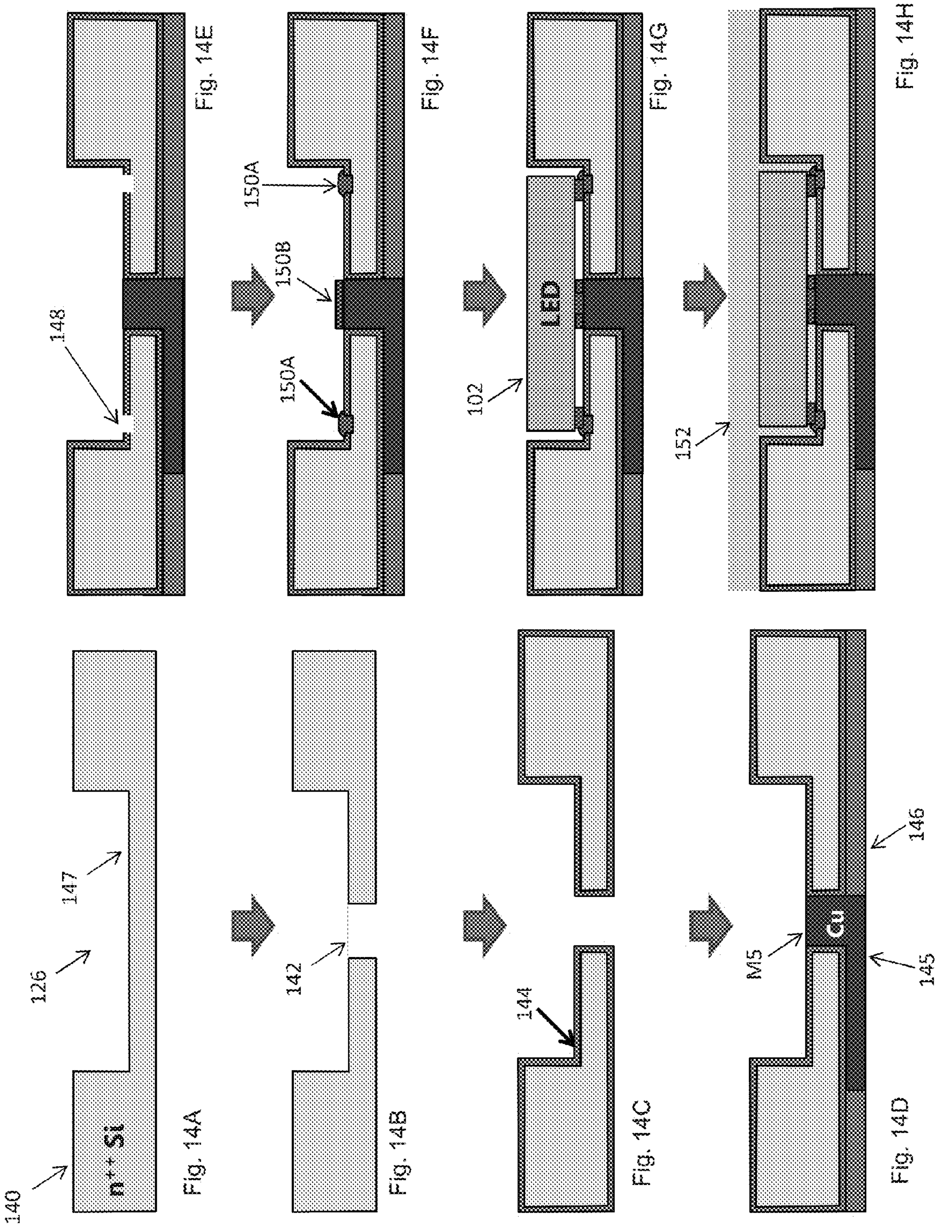
FIGS. 14A-14H are schematic side cross-sectional views illustrating a method of making a submount according to an embodiment.

In a next step illustrated in FIG. 14B, a hole 142 is formed in the floor 147. Preferably, the hole 142 is formed in the middle of the tub 126. The hole 142 may be formed through the floor 147 by laser ablation or any other suitable method, such as patterning and etching.

As discussed above, the submount substrate 140 may be made of silicon, which is semiconducting. As illustrated in FIG. 14C, a dielectric layer 144 may be formed on the surfaces of the submount substrate 140 to provide an insulation layer between the submount substrate 140 and the LED die 102. The dielectric layer 144 may be $SiO_2$ which is formed, for example, by oxidizing the surfaces of the submount substrate 140. Alternatively, the surfaces of the submount 124 may be nitrided to form a silicon nitride layer or coated with a high-K dielectric material, such as $Al_2O_3$ to form an $Al_2O_3$ layer 144. Preferably, the top, bottom and inner surfaces of the hole 142 are covered with dielectric layer 144.

In the next step illustrated in FIG. 14D, the hole 142 is filled from the back side of the submount substrate 140 with a conducting material M5, such as copper to form an interconnect 145. The interconnect 145 may be made, for example, with a dual damascene process. In the dual damascene process, an insulating layer 146 is deposited over the back side of the submount substrate 140. The insulating layer 146 is patterned and etched to form a trench in the insulating layer 146, exposing the hole 142. The trench and the hole 142 are then filled with the conducting material M5 to form the interconnect 145. To remove excess conducting material, a chemical mechanical polishing (CMP) step may be performed on the bottom side of the submount substrate 140 using the insulating layer 146 as a polishing stop.

Next, as illustrated in FIG. 14E, contact holes 148 are formed in the dielectric layer 144 inside the tubs 126 from the front side. The contact holes 148 may be made by laser ablation or any other suitable process, such as masking and etching.

Next, as illustrated in FIG. 14F, conductive material is deposited in the contact holes 148 and the surface of the conductive material M5 of the interconnect 145 to form electrical contacts 150A, 150B. The electrical contacts 150 are preferably made from a different material than the conductive material M5, such as Al or a solder material like Pb—Sn. In an embodiment, the electrical contacts 150A, 150B are formed by microdepositing by inkjet printing, aerosol spraying, or microdispensing.

In the next step illustrated in FIG. 14G, the LED die 102 is placed into the tub 126. The LED die 102 is then bonded to the electrical contacts 150A, 150B. Bonding may be accomplished by anodic bonding, thermocompression bonding, eutectic bonding, or solder bonding. In an embodiment, the LED die 102 has a reflector, such as a distributed Bragg reflector (DBR), on the same side as the electrical contacts 150A, 150B to enhance light extraction opposite from the electrical contacts 150A, 150B. In an embodiment, all LED die 102 share a common contact 150A (located on an edge) in contact holes 148 on the heavily doped silicon submount substrate 140. The common contact 150A may be either the cathode or anode. In this embodiment, each LED die 102 has one discrete (not common) contact 150B (preferably located in the center, e.g. connected to conductive material M5 of interconnect 145). In this manner, each LED die 102 can be driven independently of the other LED die 102 by applying current or voltage to the interconnect 145 of the selected LED die 102.

In the embodiment illustrated in FIGS. 14A-14H, the LED die 102 is configured to be top emitting with bottom contacts 145. In the embodiment illustrated in FIGS. 12A-C and 13, the LED die 102 is configured to be top emitting with top contacts via bond pads 130.

In another step in the method of this embodiment, illustrated in FIG. 14H, clear silicone or another radiation transmissive encapsulant 152 is deposited over the entire submount substrate 140 to protect the LED die 102 from the environment. The encapsulant 152 may be deposited by molding or screen printing and curing or any other suitable method.

Figure 15A:
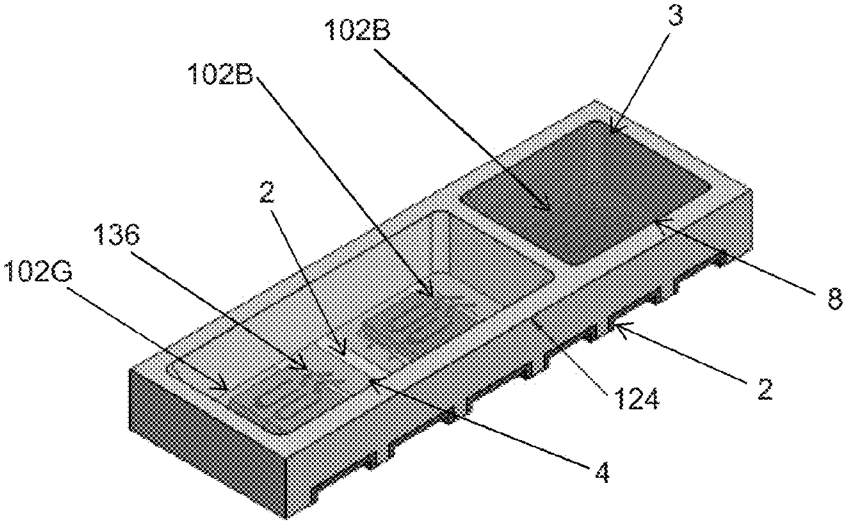
FIG. 15A is a tilted perspective view of an alternative submount.
Figure 15B:
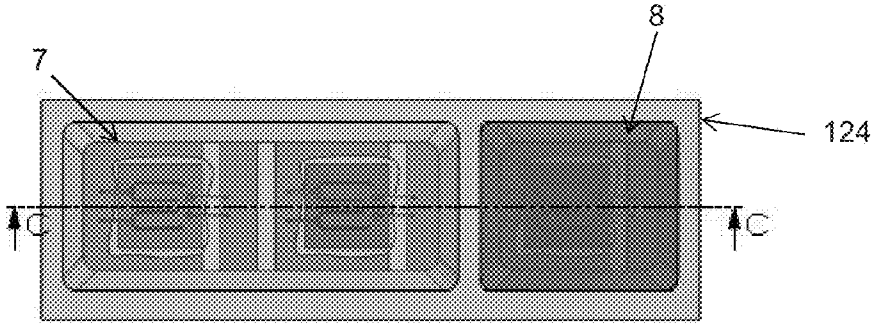
FIG. 15B is a plan view of the submount of FIG. 15A.
Figure 15C:
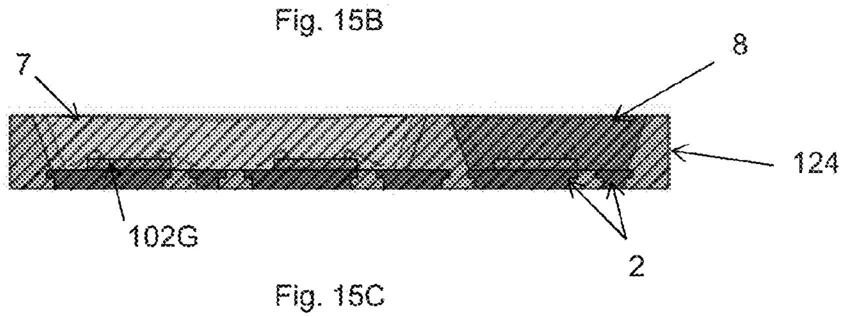
FIG. 15C is a schematic side cross-sectional view of the submount of FIG. 15A.

FIGS. 15A-15C illustrate another embodiment of a semiconductor LED submount 124 containing castellated metal contacts 2, such as the contacts described in U.S. patent application Ser. No. 14/031,751 filed on Sep. 19, 2013 and incorporated herein by reference in its entirety. The LED die 102 are placed in a submount 124, such as a rectangular box with one side open, made from a silicon substrate. The submount 124 has two tubs 3, 4 with castellated metal contacts 2 integrated in the floor of the tubs 3, 4. The contacts 2 make a connection to electrodes of an outside power supply. The green and blue LED die 102G, 102B are located in a first tub 4, and a blue LED die is located in the second tub 3. A clear encapsulant 7 is used to seal the green and blue LED dies 102G, 102B in the first tub 4. An encapsulant with a red phosphor 8 is used to seal the blue LED die 102B in the second tub 3.

The LED die 102 are mechanically attached to the bottom of the submount's tubs 3, 4 with a silicone adhesive. The LED die 102 are electrically attached to the metal contacts 2 of the submount with wire bonds 136. This package, which contains one or more LED die, can be integrated into another device, such as an LCD display.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A submount for light emitting diode (LED) die, comprising:

a substrate comprising a plurality of tubs configured to receive an LED die; and a plurality of integrated interconnects integrated into the substrate, wherein at least a portion of the interconnects for each tub have an exposed portion on a side of the submount and at least some of the plurality of the interconnects are not connected to other interconnects in the submount.

2. The submount of claim 1, wherein the submount allows electrical connection of LED die in series or in parallel or a combination of series and parallel by outside leads to the exposed portion of the interconnects on the side of the submount.

3. The submount of claim 1, further comprising a first metal layer in the tubs, the first metal layer configured to form a eutectic bond with a second metal layer on an LED die when heated.

4. The submount of claim 1, wherein the submount comprises a plurality of interconnect levels located at different depths within the submount.

5. The submount of claim 1, further comprising a plurality of conductive filled vias connecting a first set of the plurality of integrated interconnects buried in the submount to a second set of plurality of integrated interconnects on a surface of the submount.

6. The submount of claim 5, wherein the submount comprises a semiconducting silicon substrate and a dielectric layer located between the conductive filled vias and the semiconducting silicon substrate.

7. The submount of claim 6, further comprising one or more barrier layers on the surface of the dielectric layer.

8. The submount of claim 4, wherein:

the submount comprises a first buried interconnect level, a second buried interconnect level and a third buried interconnect level; and the first buried interconnect level is associated with an LED die emitting light having a first color, the second buried interconnect level is associated with an LED die emitting light having a second color and the third buried interconnect level is associated with an LED die emitting light having a third color.

9. The submount of claim 1, wherein the plurality of tapered tubs comprise a taper angle θbetween 75 and 89 degrees and wherein the plurality of integrated interconnects have a width between 0.1 and 10 μm.

10. A light emitting array comprising the submount of claim 1, a plurality of LED die mounted in the submount and a plurality of the outside leads, wherein each of the plurality of the outside leads is electrically connected to the exposed portion of one of the plurality of the interconnects on the side of the submount to allow independent addressing of the plurality of LED die.

* * * * *